(12) United States Patent
Takahashi et al.

(10) Patent No.: US 9,728,239 B2
(45) Date of Patent: Aug. 8, 2017

(54) SEMICONDUCTOR MEMORY DEVICE

(71) Applicant: KABUSHIKI KAISHA TOSHIBA, Minato-ku, Tokyo (JP)

(72) Inventors: Masahiro Takahashi, Yokohama Kanagawa (JP); Tsuneo Inaba, Kamakura Kanagawa (JP)

(73) Assignee: KABUSHIKI KAISHA TOSHIBA, Tokyo (JP)

( * ) Notice: Subject to any disclaimer, the term of this patent is extended or adjusted under 35 U.S.C. 154(b) by 0 days.

(21) Appl. No.: 15/261,680

(22) Filed: Sep. 9, 2016

(65) Prior Publication Data
US 2016/0379699 A1 Dec. 29, 2016

Related U.S. Application Data

(63) Continuation of application No. PCT/JP2014/073411, filed on Aug. 29, 2014.

(60) Provisional application No. 61/951,431, filed on Mar. 11, 2014.

(51) Int. Cl.
*G11C 11/16* (2006.01)
*G11C 7/06* (2006.01)
(52) U.S. Cl.
CPC .......... *G11C 11/1673* (2013.01); *G11C 11/16* (2013.01); *G11C 11/1657* (2013.01); *G11C 11/1675* (2013.01); *G11C 7/065* (2013.01); *G11C 7/067* (2013.01)
(58) Field of Classification Search
CPC .................. G11C 11/16; G11C 13/0069
USPC .................................. 365/158, 173
See application file for complete search history.

(56) References Cited

U.S. PATENT DOCUMENTS

| 6,714,476 | B2 * | 3/2004 | Hsu ........................... | G11C 8/10 365/149 |
| 7,254,089 | B2 * | 8/2007 | Vogelsang ............... | G11C 8/10 365/230.01 |
| 7,453,758 | B2 * | 11/2008 | Hoffmann ................ | G11C 7/06 365/189.16 |
| 8,547,724 | B2 * | 10/2013 | Lee .................... | G11C 13/0004 365/100 |
| 9,437,603 | B2 * | 9/2016 | Hsieh ................ | H01L 27/11519 |

(Continued)

FOREIGN PATENT DOCUMENTS

| JP | 2009064498 A | 3/2009 |
| JP | 2014179150 A | 9/2014 |

OTHER PUBLICATIONS

International Preliminary Report on Patentability (IPRP) and Written Opinion dated Sep. 22, 2016, issued in counterpart International Application No. PCT/JP2014/073411.

(Continued)

*Primary Examiner* — Michael Tran
(74) *Attorney, Agent, or Firm* — Holtz, Holtz & Volek PC

(57) ABSTRACT

According to one embodiment, a semiconductor memory device includes a first memory cell array including a first memory cell having a variable resistive element, a second memory cell array including a second memory cell having the variable resistive element, a reference signal generation circuit which generates a reference signal, a sense amplifier having a first input terminal and a second input terminal, and a read enable control circuit which generates a read enable signal in accordance with a command from outside and control switching between a single cell read mode and a twin cell read mode.

24 Claims, 18 Drawing Sheets

(56) References Cited

U.S. PATENT DOCUMENTS

2004/0062074 A1    4/2004  Ooishi
2012/0155146 A1    6/2012  Ueda et al.
2014/0281189 A1    9/2014  Noguchi et al.

OTHER PUBLICATIONS

International Search Report (ISR) and Written Opinion dated Oct. 14, 2014 issued in International Application No. PCT/JP2014/073411.

\* cited by examiner

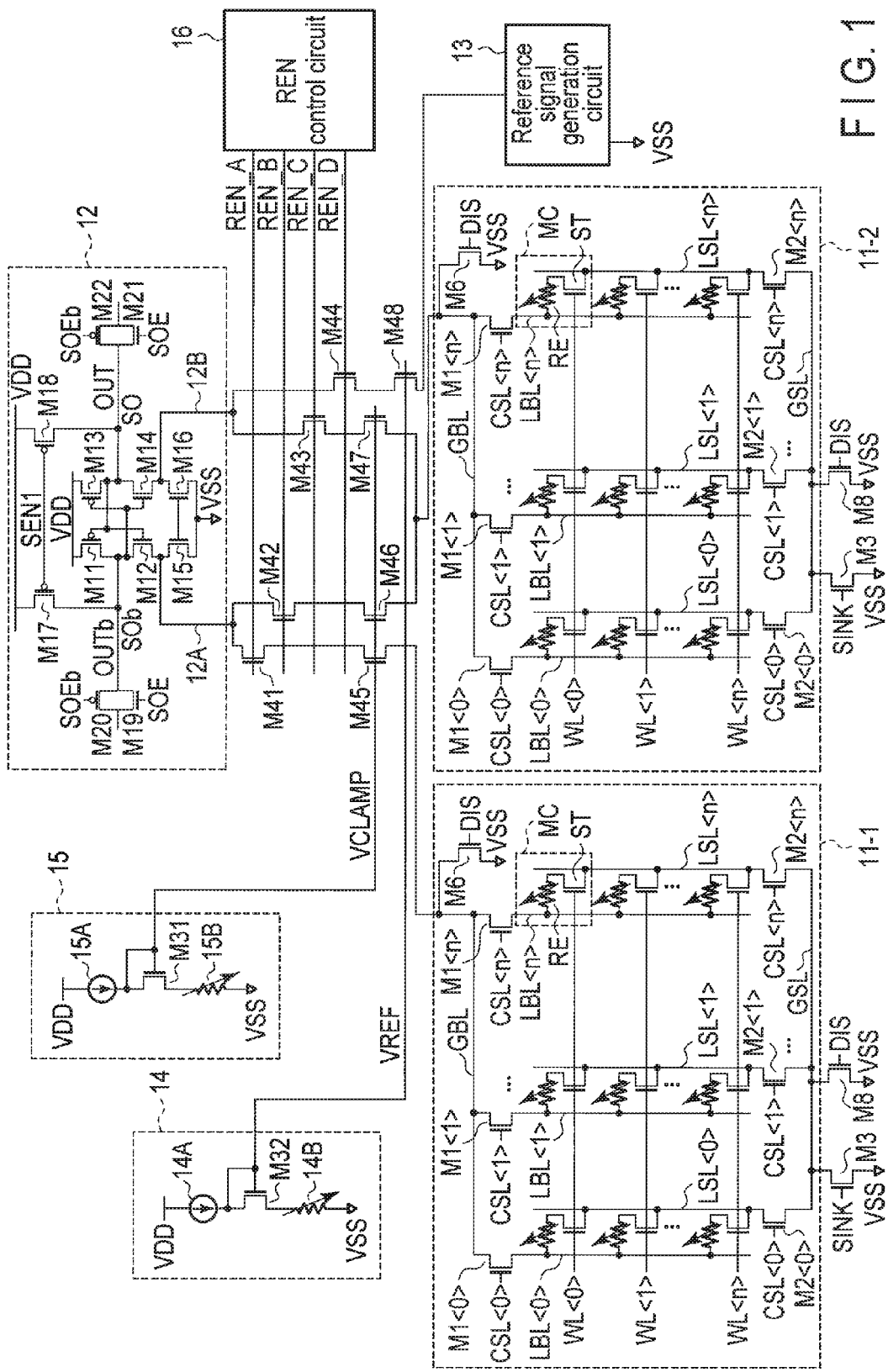
F I G. 1

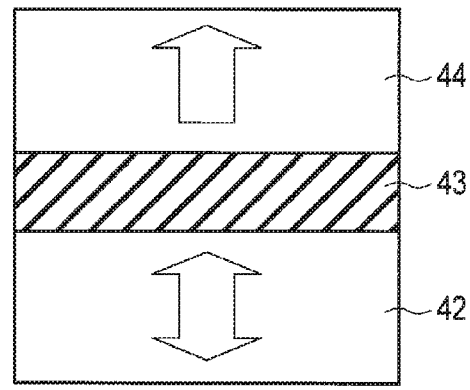
FIG. 2A
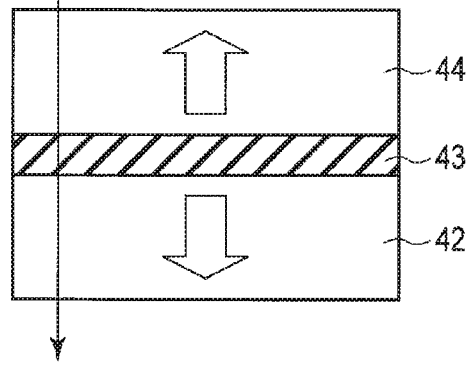
FIG. 2B  Parallel state (low resistance)
FIG. 2C  Antiparallel state (high resistance)

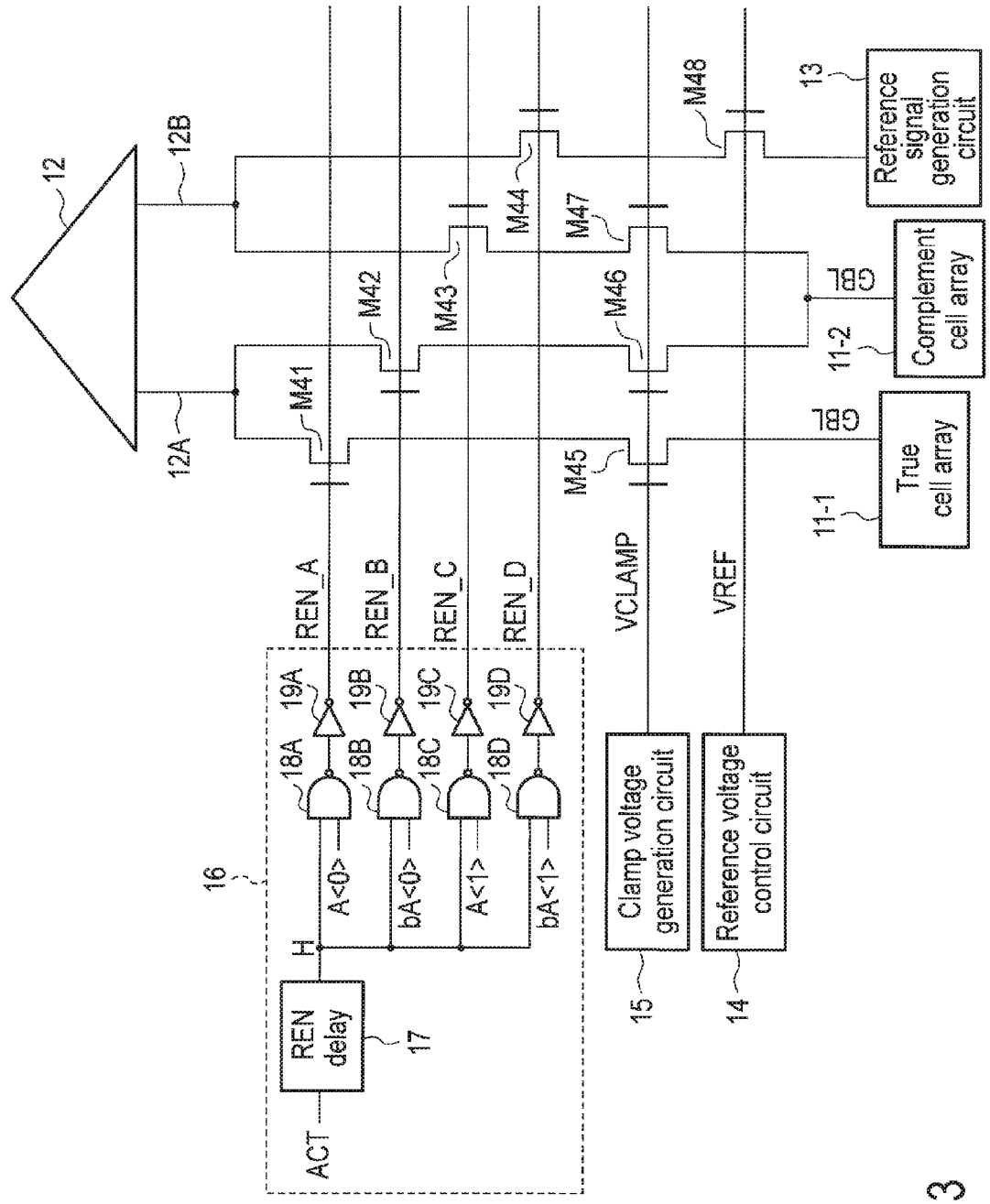
F I G. 3

| A<1> | A<0> | REN_D | REN_C | REN_B | REN_A | VCLAMP | VREF | Operation |
|---|---|---|---|---|---|---|---|---|
| L | L | H | L | H | L | M | M | Single Complement cell |
| L | H | H | L | L | H | M | M | Single True cell |
| H | H | L | H | L | H | M | M | Twin True cell |

FIG. 4

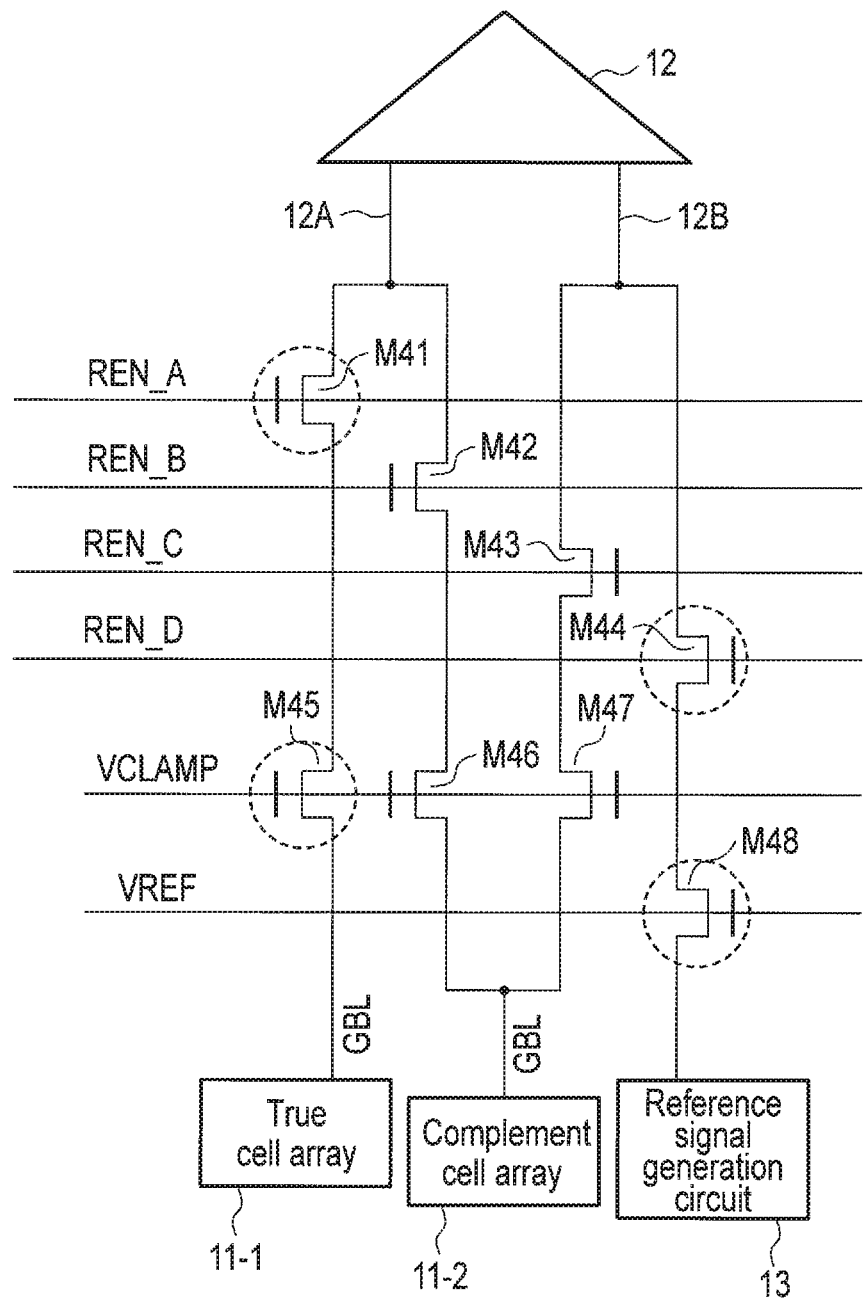
F I G. 6

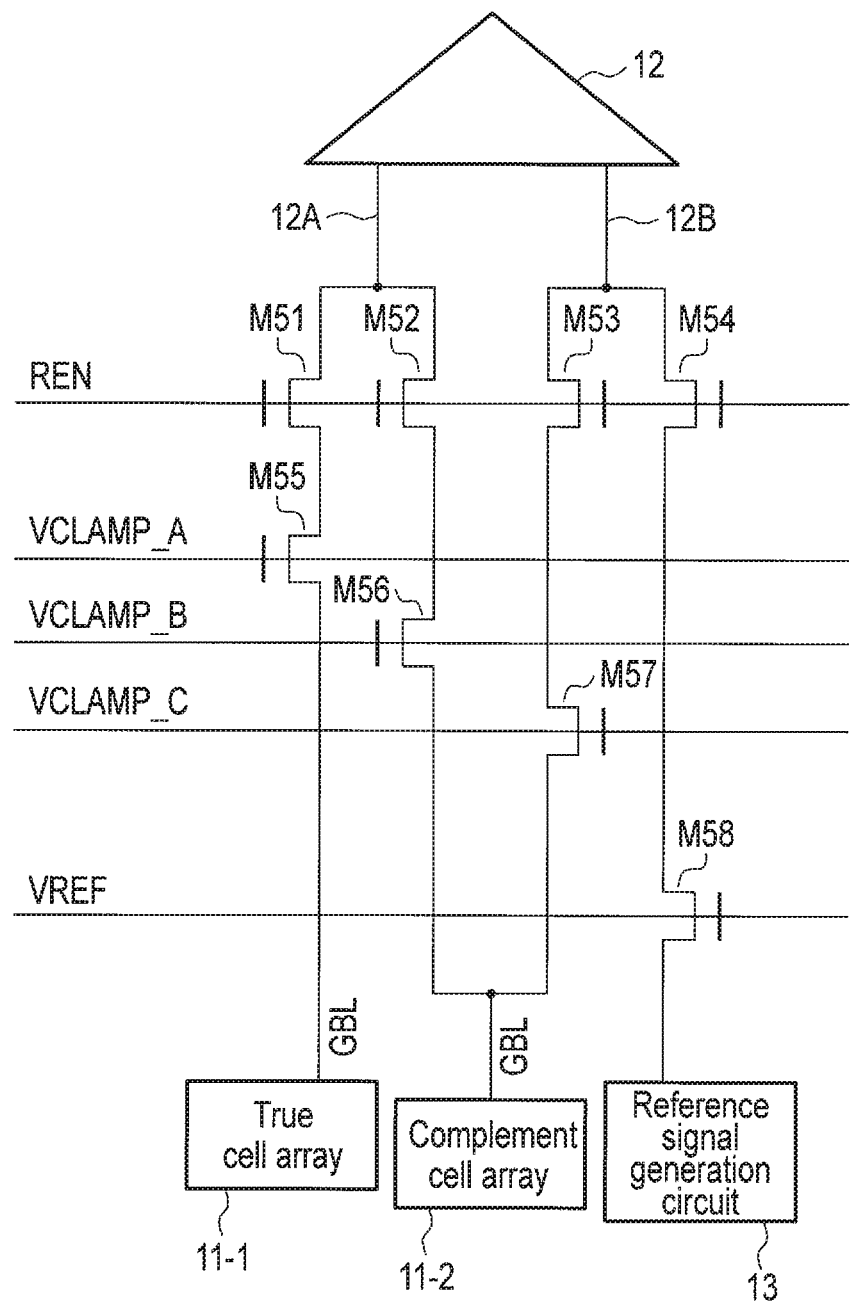
F I G. 12

| VCLAMP_C | VCLAMP_B | VCLAMP_A | VREF | REN | Operation |
|---|---|---|---|---|---|
| L | M | L | M | H | Single Complement cell |
| L | L | M | M | H | Single True cell |
| M | L | M | L | H | Twin True cell |

F I G. 13

| REN_C | REN_B | REN_A | VCLAMP_B | VCLAMP_A | VREF | Operation |
|---|---|---|---|---|---|---|
| H | H | L | M | L | M | Single Complement cell |
| H | L | H | L | M | M | Single True cell |
| L | H | H | L | M | L | Twin True cell |

FIG. 16

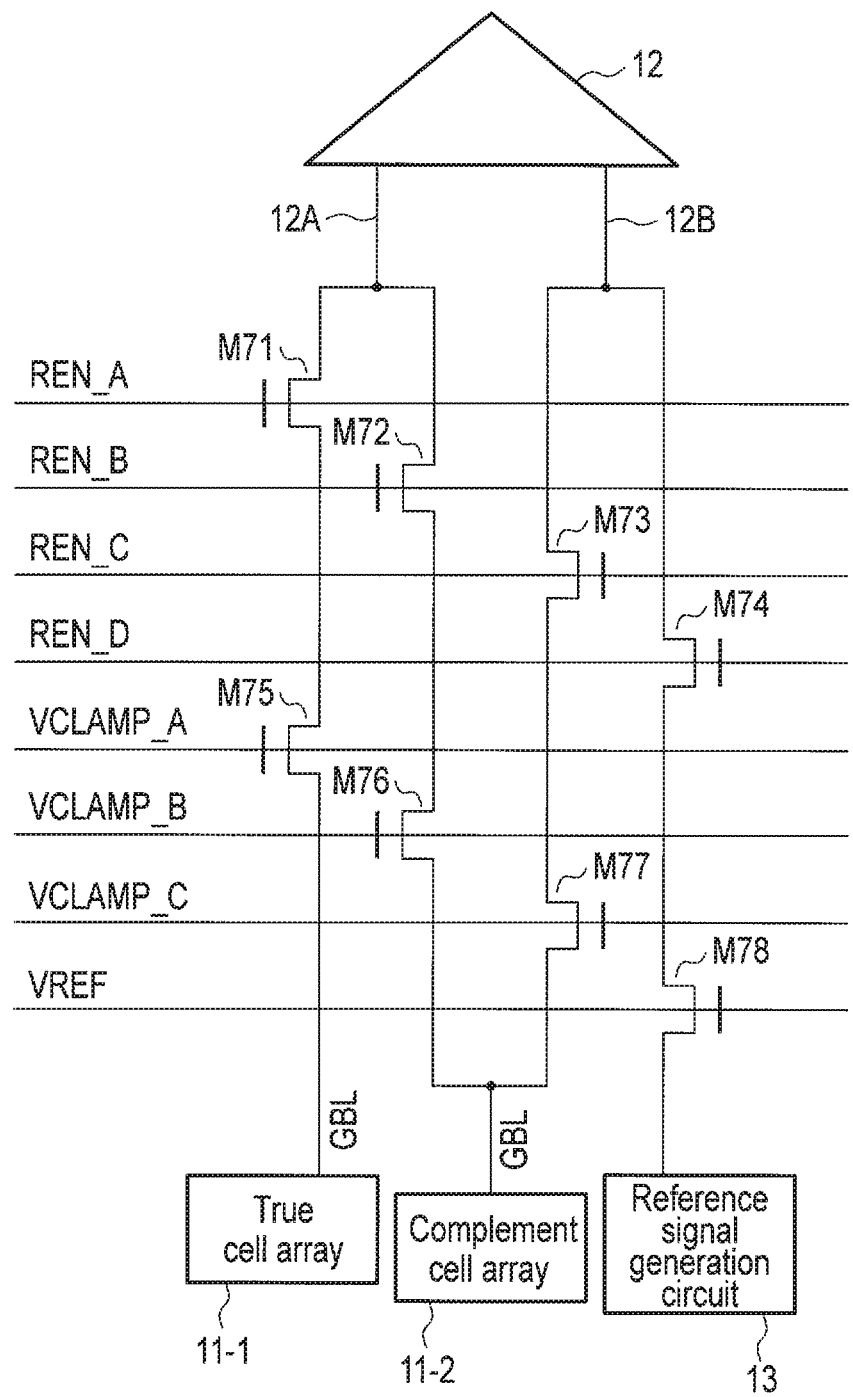
F I G. 17

SEMICONDUCTOR MEMORY DEVICE

CROSS REFERENCE TO RELATED APPLICATIONS

This application is a Continuation Application of PCT Application No. PCT/JP2014/073411, filed Aug. 29, 2014 and based upon and claims the benefit of priority from U.S. Provisional Application No. 61/951,431, filed Mar. 11, 2014, the entire contents of all of which are incorporated herein by reference.

FIELD

Embodiments described herein relate generally to a semiconductor memory device.

BACKGROUND

An MRAM (Magnetic Random Access Memory) is a memory device using a memory element having a magnetoresistive effect in a memory cell configured to store information. The MRAM has received attention as a next-generation memory device that features a high-speed operation, large capacity, and nonvolatileness.

The read operation of the MRAM includes single cell read and twin cell read.

BRIEF DESCRIPTION OF THE DRAWINGS

FIG. 1 is a circuit diagram showing the arrangement of a semiconductor memory device according to the first embodiment;

FIG. 2A is a sectional view showing the schematic arrangement of a variable resistive element;

FIG. 2B is a sectional view showing the magnetoresistive element in a parallel state so as to explain the write operation of the variable resistive element;

FIG. 2C is a sectional view showing the magnetoresistive element in an antiparallel state so as to explain the write operation of the variable resistive element;

FIG. 3 is a circuit diagram showing the arrangement of a REN control circuit according to the first embodiment;

FIG. 4 is a table showing the truth values of operations by the REN control circuit;

FIG. 6 is a circuit diagram showing the single true cell operation of a true cell MC;

FIG. 12 is a circuit diagram showing the arrangement and operation of a semiconductor memory device according to the fourth embodiment;

FIG. 13 is a table showing the truth values of operations by a clamp voltage generation circuit and a reference voltage generation circuit;

FIG. 16 is a table showing the truth values of operations by a REN control circuit, a clamp voltage generation circuit, and a reference voltage generation circuit;

FIG. 17 is a circuit diagram showing a modification of the arrangement and operation of the semiconductor memory device according to the sixth embodiment.

DETAILED DESCRIPTION

Figure 5:
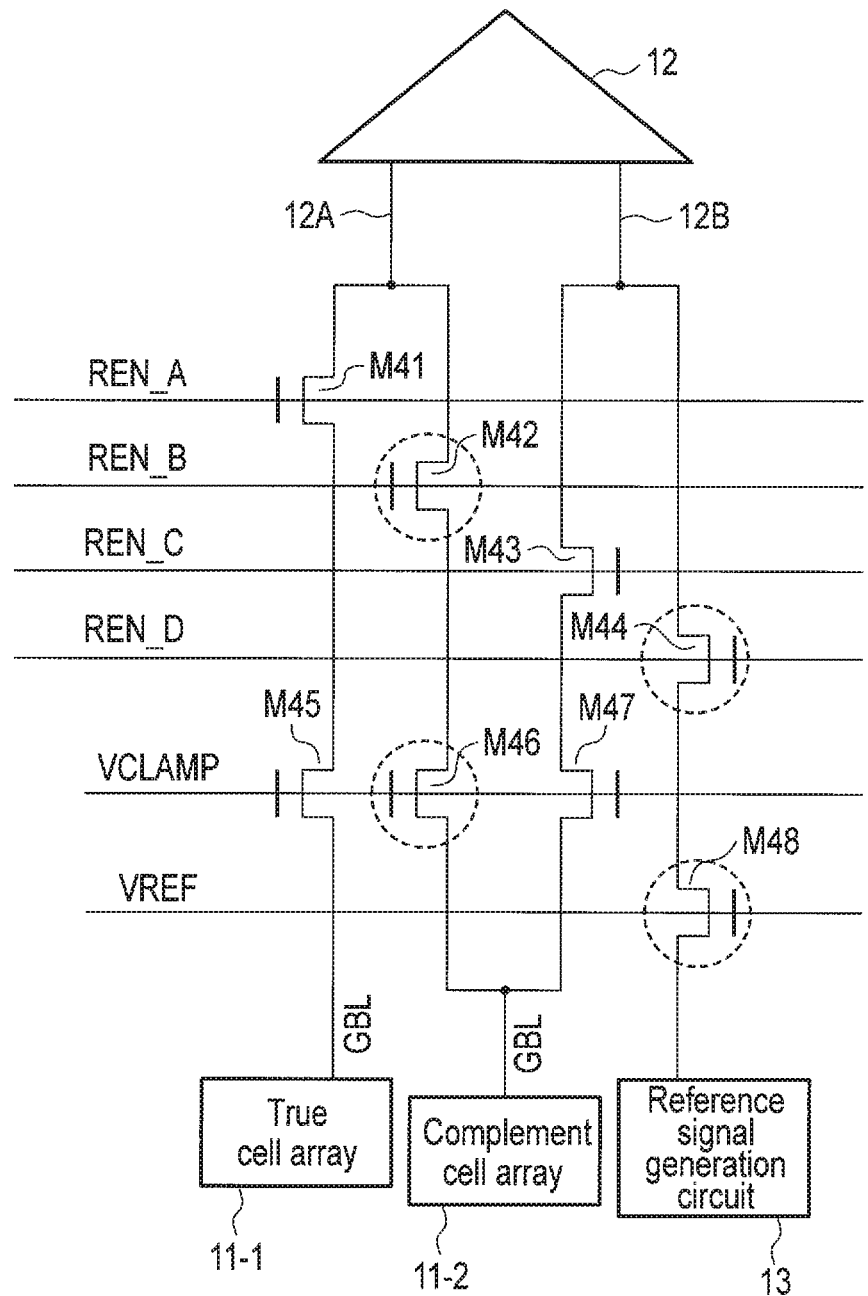
FIG. 5 is a circuit diagram showing the single complement cell operation of a complement cell MC.

In single cell read, a memory cell array is electrically connected to one input terminal of a sense amplifier via a memory cell path, and a reference signal generation circuit including a reference cell and the like is electrically connected to the other input terminal via a reference path. For example, a current or voltage of the intermediate level between "1" data and "0" data is generated in the reference path. The current or voltage generated in the reference path is compared with the current or voltage generated in the memory cell path, thereby reading data stored in the memory cell.

On the other hand, in twin cell read, a read target true cell array is electrically connected to one input terminal of a sense amplifier via a true path, and a complement cell array is electrically connected to the other input terminal via a complement path. When "1" data is stored in the true cell, "0" data is stored in the complement cell. When "0" data is stored in the true cell, "1" data is stored in the complement cell. The current or voltage generated in the complement path is compared with the current or voltage generated in the true path, thereby reading data stored in the true cell.

In the above-described single cell read, since all memory cell arrays can be used as a storage area, the memory capacity can be increased. On the other hand, in twin cell read, since the difference (read margin) between the current or voltage generated in the true path and the current or voltage generated in the complement path can be made large, the reliability of the memory is high.

A semiconductor memory device formed on a single chip is required to implement switching between the single cell read and the twin cell read.

In general, according to one embodiment, a semiconductor memory device includes a first memory cell array including a first memory cell having a variable resistive element, a second memory cell array including a second memory cell having the variable resistive element, a reference signal generation circuit which generates a reference signal, a sense amplifier having a first input terminal and a second input terminal, and a read enable control circuit which generates a read enable signal in accordance with a command from outside and control switching between a single cell read mode and a twin cell read mode.

The embodiments will now be described with reference to the accompanying drawings. The same reference numerals denote the same parts throughout the drawings. A repetitive description will be done as needed.

<First Embodiment>

A semiconductor memory device according to the first embodiment will now be described with reference to FIGS. 1, 2A, 2B, 2C, 3, 4, 5, 6, 7, and 8. In the first embodiment, a true cell array 11-1, a complement cell array 11-2, and a reference signal generation circuit 13 are electrically connected to a sense amplifier 12 via series-connected elements (current paths) including switching elements. A REN (read enable) control circuit 16 controls read enable signals (sense amplifier activation signals), thereby controlling the conduction states of the series-connected elements and switching between single cell read and twin cell read. The first embodiment will be described below in detail.

[Arrangement and Operation of First Embodiment]

The arrangement and operation of the semiconductor memory device according to the first embodiment will be described with reference to FIGS. 1, 2A, 2B, 2C, 3, 4, 5, 6, and 7. Although an MRAM that stores data using a magnetoresistive element (MTJ element) will be exemplified here, the semiconductor memory device is not limited to this. This embodiment is applicable to any memory that converts the resistance difference of a variable resistive element into a current difference or voltage difference and senses it.

The arrangement of the semiconductor memory device according to the first embodiment will be explained first.

FIG. 1 is a circuit diagram showing the arrangement of the semiconductor memory device according to the first embodiment.

As shown in FIG. 1, the semiconductor memory device includes the true cell array 11-1, the complement cell array 11-2, the sense amplifier 12, the reference signal generation circuit 13, a reference signal control circuit 14, a clamp voltage generation circuit 15, and the REN control circuit 16.

The true cell array 11-1 includes a plurality of memory cells (true cells) MC arrayed in a matrix at positions where local bit lines LBL<0> to LBL<n> and local source lines LSL<0> to LSL<n> cross word lines WL<0> to WL<n>. Note that n is 0, 1, 2, . . . , n.

Each true cell MC includes, for example, a variable resistive element RE and a select transistor ST. The variable resistive element RE is an element that changes the resistance value by applying a current (or voltage). The variable resistive element RE includes, for example, an MTJ (Magnetic Tunnel Junction) element, a phase change element, and a ferroelectric element. The gate of the select transistor ST is electrically connected to the word line WL. The true cell MC is selected when the select transistor ST is turned on by the word line WL. Note that a case where the variable resistive element RE is an MTJ element (magnetoresistive element) will be described here.

FIG. 2A is a sectional view showing the schematic arrangement of the variable resistive element (magnetoresistive element) RE. As the variable resistive element RE, a storage layer 42, a tunnel barrier layer 43, and a reference layer 44 are mainly illustrated here.

As shown in FIG. 2A, the variable resistive element RE includes a stacked body formed from the storage layer 42 that is a ferromagnetic layer, the reference layer 44 that is a ferromagnetic layer, and the tunnel barrier layer 43 that is a nonmagnetic layer formed between them.

The storage layer 42 is a ferromagnetic layer having a variable magnetization direction, and has a perpendicular magnetic anisotropy perpendicular or almost perpendicular to the film surface (upper surface/lower surface). "Variable magnetization direction" means that the magnetization direction changes for a predetermined write current. "Almost perpendicular" means that the direction of a residual magnetization falls within the range of $45°<\theta\leq90°$ with respect to the film surface.

The tunnel barrier layer 43 is formed on the storage layer 42. The tunnel barrier layer 43 a nonmagnetic layer and is made of, for example, MgO.

The reference layer 44 is formed on the tunnel barrier layer 43. The reference layer 44 is a ferromagnetic layer having an unchangeable magnetization direction, and has a perpendicular magnetic anisotropy perpendicular or almost perpendicular to the film surface. "Unchangeable magnetization direction" means that the magnetization direction does not change for a predetermined write current. That is, the magnetization direction inverting energy barrier of the reference layer 44 is larger than that of the storage layer 42.

FIG. 2B is a sectional view showing the magnetoresistive element in the parallel state (P state) so as to explain the write operation of the magnetoresistive element. FIG. 2C is a sectional view showing the magnetoresistive element in the antiparallel state (AP state) so as to explain the write operation of the magnetoresistive element.

The variable resistive element RE is, for example, a spin transfer torque magnetoresistive element. Hence, when writing data in the variable resistive element RE or when reading data from the variable resistive element RE, a current is bidirectionally supplied to the variable resistive element RE in a direction perpendicular to the film surface.

More specifically, data is written in the variable resistive element RE in the following way.

As shown in FIG. 2B, when a current flows from the storage layer 42 to the reference layer 44, that is, electrons traveling from the reference layer 44 to the storage layer 42 are supplied, electrons that are spin-polarized in the same direction as the magnetization direction of the reference layer 44 are injected into the storage layer 42. In this case, the magnetization direction of the storage layer 42 matches that of the reference layer 44. The magnetization direction of the reference layer 44 and that of the storage layer 42 thus attain a parallel alignment. In this parallel state, the resistance value of the variable resistive element RE is minimized. This case will be defined as, for example, "0" data.

On the other hand, as shown in FIG. 2C, when a current flows from the reference layer 44 to the storage layer 42, that is, electrons traveling from the storage layer 42 to the reference layer 44 are supplied, electrons that are reflected by the reference layer 44 and thus spin-polarized in a direction opposite to the magnetization direction of the reference layer 44 are injected into the storage layer 42. In this case, the magnetization direction of the storage layer 42 is reverse to that of the reference layer 44. The magnetization direction of the reference layer 44 and that of the storage layer 42 thus attain an antiparallel alignment. In this antiparallel state, the resistance value of the variable resistive element RE is maximized. This case will be defined as, for example, "1" data.

Data is read from the variable resistive element RE in the following way.

A read current is supplied to the variable resistive element RE. This read current is set to a value (a value smaller than a write current) that does not invert the magnetization direction of the storage layer 42. A change in the resistance value of the variable resistive element RE at this time is detected, thereby reading the "0" data and "1" data.

Referring back to FIG. 1, one end of each of the local source lines LSL<0> to LSL<n> is electrically connected to a global source line GSL via a corresponding one of column select transistors M2<0> to M2<n>. Column select signals CSL<0> to CSL<n> are supplied to the gates of the column select transistors M2<0> to M2<n>, respectively.

The global source line GSL is electrically connected to a ground potential terminal VSS via an nMOS transistor M3. A signal SINK is supplied to the gate of the nMOS transistor M3. The global source line GSL is also electrically connected to the ground potential terminal VSS via an nMOS transistor M8. A discharge signal DIS is supplied to the gate of the nMOS transistor M8.

One end of each of the local bit lines LBL<0> to LBL<n> is electrically connected to a global bit line GBL via a corresponding one of column select transistors M1<0> to M1<n>. The column select signals CSL<0> to CSL<n> are supplied to the gates of the column select transistors M1<0> to M1<n>, respectively.

The global bit line GBL in the true cell array 11-1 is electrically connected to a first input terminal 12A of the sense amplifier 12 via a first series-connected element (true path) including switching elements. More specifically, the global bit line GBL in the true cell array 11-1 is electrically connected to the connection node between nMOS transistors M12 and M15 in the sense amplifier 12 via the first series-connected element including a clamp transistor M45 and an nMOS transistor (read enable transistor) M41 whose current paths are connected in series. The global bit line GBL is also electrically connected to the ground potential terminal VSS via an nMOS transistor M6. The discharge signal DIS is supplied to the gate of the nMOS transistor M6.

The complement cell array 11-2 includes the plurality of memory cells (complement cells) MC arrayed in a matrix at positions where the local bit lines LBL<0> to LBL<n> and the local source lines LSL<0> to LSL<n> cross the word lines WL<0> to WL<n>. Note that the arrangement of the complement cell array 11-2 is the same as the true cell array 11-1, and a description thereof will be omitted.

The true cell MC indicates a cell that stores data and becomes a read target at the time of twin cell read. On the other hand, the complement cell MC indicates a cell that stores data (opposite data) complementing the true cell MC at the time of twin cell read. Both the true cell MC and the complement cell MC store data at the time of single cell read. In other words, only the true cell array 11-1 serves as a storage area in twin cell read, whereas both the true cell array 11-1 and the complement cell array 11-2 serve as a storage area in single cell read.

The global bit line GBL in the complement cell array 11-2 is electrically connected to the first input terminal 12A of the sense amplifier 12 via a second series-connected element (first complement path) including switching elements. More specifically, the global bit line GBL in the complement cell array 11-2 is electrically connected to the connection node between the nMOS transistors M12 and M15 in the sense amplifier 12 via the second series-connected element including a clamp transistor M46 and an nMOS transistor (read enable transistor) M42 whose current paths are connected in series.

The global bit line GBL in the complement cell array 11-2 is also electrically connected to a second input terminal 12B of the sense amplifier 12 via a third series-connected element (second complement path) including switching elements. More specifically, the global bit line GBL in the complement cell array 11-2 is electrically connected to the connection node between nMOS transistors M14 and M16 in the sense amplifier 12 via the third series-connected element including a clamp transistor M47 and an nMOS transistor (read enable transistor) M43 whose current paths are connected in series.

The reference signal generation circuit 13 includes, for example, a reference cell that stores "1" data and a reference cell that stores "0" data. The reference signal generation circuit 13 generates a reference signal (reference current or reference voltage) of the intermediate level between "1" data and "0" data using these reference cells. The reference signal generation circuit 13 is electrically connected to the second input terminal 12B of the sense amplifier 12 via a fourth series-connected element (reference path) including switching elements. More specifically, the reference signal generation circuit 13 is electrically connected to the connection node between the nMOS transistors M14 and M16 in the sense amplifier 12 via the fourth series-connected element including a reference transistor M48 and an nMOS transistor (read enable transistor) M44 whose current paths are connected in series.

Note that the reference signal generation circuit 13 may include fixed resistors in place of the reference cells, and the reference signal may be generated by the fixed resistors.

The sense amplifier 12 is, for example, a current detection sense amplifier. The sense amplifier 12 includes a first inverter, a second inverter, the nMOS transistors M15 and M16, pMOS transistors M17 and M18, first pass transistors, and second pass transistors.

The first inverter includes a pMOS transistor M11 and the nMOS transistor M12. The first inverter includes a first input terminal, a first output terminal, and first and second voltage terminals. The second inverter includes a pMOS transistor M13 and the nMOS transistor M14. The second inverter includes a second input terminal, a second output terminal, and third and fourth voltage terminals.

The first voltage terminal (one terminal of the pMOS transistor M11) and the third voltage terminal (one terminal of the pMOS transistor M13) are electrically connected to a power supply voltage terminal VDD. The second input terminal (the gates of the pMOS transistor M13 and the nMOS transistor M14) is electrically connected to the first output terminal (the other terminal of the pMOS transistor M11 and one terminal of the nMOS transistor M12), and the second output terminal (the other terminal of the pMOS transistor M13 and one terminal of the nMOS transistor M14) is electrically connected to the first input terminal (the gates of the pMOS transistor M11 and the nMOS transistor M12).

The first pass transistors include an nMOS transistor M19 and a pMOS transistor M20. The second pass transistors include an nMOS transistor M21 and a pMOS transistor M22.

One end of the current path of the pMOS transistor (sense enable transistor) M17 is electrically connected to the first output terminal of the first inverter, and the other end of the current path of the pMOS transistor M17 is electrically connected to the power supply voltage terminal VDD. One end of the current path of the pMOS transistor (sense enable transistor) M18 is electrically connected to the second output terminal of the second inverter, and the other end of the current path of the pMOS transistor M18 is electrically connected to the power supply voltage terminal VDD. A sense enable signal SEN1 is supplied to the gates of the pMOS transistors M17 and M18.

In addition, the first pass transistors (transistors M19 and M20) are electrically connected to the first output terminal of the first inverter. Output enable signals SOE and SOEb are supplied to the gates of the transistors M19 and M20, respectively. The second pass transistors (transistors M21 and M22) are electrically connected to the second output terminal of the second inverter. The output enable signals SOE and SOEb are supplied to the gates of the transistors M21 and M22, respectively.

One end of the current path of the nMOS transistor M15 is electrically connected to the second voltage terminal (the other end of the current path of the transistor M12) of the first inverter, and the other end of the current path of the nMOS transistor M15 is electrically connected to the ground potential terminal VSS. One end of the current path of the nMOS transistor M16 is electrically connected to the fourth voltage terminal (the other end of the current path of the transistor M14) of the second inverter, and the other end of the current path of the nMOS transistor M16 is electrically connected to the ground potential terminal VSS. A sense enable signal SEN2 is supplied to the gates of the nMOS transistors M15 and M16.

The second voltage terminal (the other end of the current path of the transistor M12, that is, the first input terminal 12A of the sense amplifier 12) of the first inverter is electrically connected to one end of the current path of the nMOS transistor M41. The other end of the current path of the nMOS transistor M41 is electrically connected to one end of the current path of the nMOS transistor M45. The other end of the current path of the nMOS transistor M45 is electrically connected to the global bit line GBL of the true cell array 11-1.

The second voltage terminal (the other end of the current path of the transistor M12, that is, the first input terminal 12A of the sense amplifier 12) of the first inverter is also electrically connected to one end of the current path of the nMOS transistor M42. The other end of the current path of the nMOS transistor M42 is electrically connected to one end of the current path of the nMOS transistor M46. The other end of the current path of the nMOS transistor M46 is electrically connected to the global bit line GBL of the complement cell array 11-2.

The fourth voltage terminal (the other end of the current path of the transistor M14, that is, the second input terminal 12B of the sense amplifier 12) of the second inverter is electrically connected to one end of the current path of the nMOS transistor M43. The other end of the current path of the nMOS transistor M43 is electrically connected to one end of the current path of the nMOS transistor M47. The other end of the current path of the nMOS transistor M47 is electrically connected to the global bit line GBL of the complement cell array 11-2.

The fourth voltage terminal (the other end of the current path of the transistor M14, that is, the second input terminal 12B of the sense amplifier 12) of the second inverter is also electrically connected to one end of the current path of the nMOS transistor M44. The other end of the current path of the nMOS transistor M44 is electrically connected to one end of the current path of the nMOS transistor M48. The other end of the current path of the nMOS transistor M48 is electrically connected to the reference signal generation circuit 13.

The REN control circuit 16 supplies read enable signals REN_A to REN_D to the gates of the nMOS transistors M41 to M44, respectively. The clamp voltage generation circuit 15 supplies a clamp voltage signal VCLAMP to the gates of the nMOS transistors M45 to M47. The reference signal control circuit 14 supplies a reference voltage signal VREF to the gate of the nMOS transistor M48.

The reference signal control circuit 14 generates the reference voltage signal VREF and supplies it to the gate of the nMOS transistor M48. The reference signal control circuit 14 includes a constant current source 14A, an nMOS transistor M32, and a variable resistor 14B. The drain and gate of the nMOS transistor M32 are electrically connected so as to be diode-connected. The constant current source 14A that flows a constant current is electrically connected to the drain of the nMOS transistor M32. One terminal of the variable resistor 14B is electrically connected to the source of the nMOS transistor M32, and the ground potential terminal VSS is electrically connected to the other terminal of the variable resistor 14B. The reference signal control circuit 14 supplies the reference voltage signal VREF from the gate of the nMOS transistor M32 to the gate of the nMOS transistor M48.

The clamp voltage generation circuit 15 generates the clamp voltage signal VCLAMP and supplies it to the gates of the nMOS transistors M45 to M47. The clamp voltage generation circuit 15 includes a constant current source 15A, an nMOS transistor M31, and a variable resistor 15B. The drain and gate of the nMOS transistor M31 are electrically connected so as to be diode-connected. The constant current source 15A that flows a constant current is electrically connected to the drain of the nMOS transistor M31. One terminal of the variable resistor 15B is electrically connected to the source of the nMOS transistor M31, and the ground potential terminal VSS is electrically connected to the other terminal of the variable resistor 15B. The clamp voltage generation circuit 15 supplies the clamp voltage signal VCLAMP from the gate of the nMOS transistor M31 to the gates of the nMOS transistors M45 to M47.

The REN control circuit 16 generates the read enable signals REN_A to REN_D and supplies them to the gates of the nMOS transistors M41 to M44, respectively. Details of the arrangement and operation of the REN control circuit 16 will be described later with reference to FIG. 3.

The read enable signals REN_A to REN_D are signals of "high (H)" level (for example, 1.2 V) or "low (L)" level (for example, 0 V). That is, "H" level is a voltage that sufficiently turns on the nMOS transistors M41 to M44, and "L" level is a voltage that turns off the nMOS transistors M41 to M44.

The clamp voltage signal VCLAMP and the reference voltage signal VREF are signals of "middle (M)" level (for example, 0.1 to 0.6 V) or "L" level. "M" level is an analog signal. "M" level is a voltage that restricts a current flowing to the selected memory cell MC at the time of read so that the current does not exceed the upper limit, thereby preventing destruction of data stored in the selected memory cell MC. "L" level is a voltage that turns off the nMOS transistors M45 to M48.

The read operation by the sense amplifier 12 will be described next.

The signals and operation in a standby state before the start of read operation are as follows.

The sense enable signal SEN1 is "L" level, and the sense enable transistors M17 and M18 are on. The discharge signal DIS is "H" level, and the discharge transistors M6 and M8 are on.

The word lines WL, the column select signal CSL<n>, the signal SINK, the sense enable signal SEN2, and the signal SOE are "L" level, and the signal SOEb is "H" level. Hence, the MOS transistors connected to these signals are off. The read enable signals REN_A to REN_D are "L" level, and the read enable transistors M41 to M44 are off. The clamp voltage signal VCLAMP is "M" level that is an analog signal, and the clamp transistors M45 to M47 are on. In addition, the reference voltage signal VREF is "M" level that is an analog signal, and the reference transistor M48 is on.

The signals and operation in the read operation are as follows.

In the sense amplifier 12, the sense enable signal SEN1 is "L" level, and nodes SO and Sob are precharged to the power supply voltage terminal VDD as the initial state.

In the memory cell arrays (the true cell array 11-1 and the complement cell array 11-2), the column select signal CSL<n> changes to "H" level, and the local bit line LBL<n> and the local source line LSL<n> are selected. The word line WL<n> is driven, and read target memory cells (the true cell MC and the complement cell MC) are selected. The discharge signal DIS changes to "L" level, and the discharge transistors M6 and M8 are turned off. The signal SINK changes to "H" level, and the sink transistor M3 is turned on. The sink transistor M3 is turned on at a timing before currents (a true cell current and a complement cell current) are supplied to the memory cells MC.

The read enable signal REN_A or REN_B changes to "H" level, and the read enable transistor M41 or M42 is turned on. Additionally, the read enable signal REN_C or REN_D changes to "H" level, and the read enable transistor M43 or M44 is turned on. That is, one of the true path and the first complement path and one of the second complement path and a reference path are rendered conductive. This makes it possible to control switching between single cell read and twin cell read. Details of switching between single cell read and twin cell read by the read enable signals REN_A to REN_D will be described later with reference to FIGS. 3, 4, 5, 6, and 7.

Next, the sense enable signal SEN1 changes to "H" level, and the sense enable transistors M17 and M18 are turned off. Precharge of the nodes SO and SOb thus stops. As a result, the true cell current and the complement cell current are supplied from only the power supply voltage terminal VDD connected to one terminal sides of the pMOS transistors M11 and M13. At this time, the true cell current and the complement cell current change in accordance with data ("0" data or "1" data) stored in the selected memory cell MC. That is, the true cell current and the complement cell current change depending on whether the selected memory cell MC is in a low resistance state or a high resistance state.

After that, the sense enable signal SEN2 changes to "H" level, and the sense enable transistors M15 and M16 are turned on. The current (true cell current or complement cell current) flowing to the first input terminal 12A of the sense amplifier 12 and the current (complement cell current or true cell current) flowing to the second input terminal 12B are thus compared. More specifically, in single cell read, the true cell current or complement cell current flowing to the first input terminal 12A is compared with the reference current flowing to the second input terminal. On the other hand, in twin cell read, the true cell current flowing to the first input terminal 12A is compared with the complement cell current flowing to the second input terminal. A latch circuit formed from the pMOS transistors M11 and M13 and the nMOS transistors M12 and M14 holds "H" level or "L" level in accordance with the comparison result.

Finally, the output enable signal SOE changes to "H" level, the output enable signal SOEb changes to "L" level, and the nMOS transistors M19 and M21 and the pMOS transistors M20 and M22 are turned on. The "H" level or "L" level held by the latch circuit is thus output from the nodes SO and SOb as output signals OUT and OUTb, respectively.

Note that in this embodiment, an example in which the sense amplifier 12 is a current detection sense amplifier configured to detect a reference current has been described. However, the sense amplifier is not limited to this and may be a voltage detection sense amplifier configured to detect a reference voltage. In this case, the reference signal generation circuit 13 generates a reference voltage as a reference signal.

FIG. 3 is a circuit diagram showing the arrangement of the REN control circuit 16 according to the first embodiment.

As shown in FIG. 3, the REN control circuit 16 includes a REN delay circuit 17, NAND circuits 18A to 18D, and inverter circuits 19A to 19D.

The REN delay circuit 17 outputs a received activation signal ACT of "H" level to the inverter circuits 19A to 19D. The activation signal ACT is input from, for example, a decoder (not shown) to the REN control circuit 17. At this time, the REN delay circuit 17 delays the output of the activation signal ACT so as to synchronize it with access to the word line WL by the decoder.

The NAND circuit 18A performs a NAND operation between a signal A<0> and the activation signal ACT of "H" level output from the REN delay circuit 17, and outputs the operation result to the inverter circuit 19A. The signal A<0> is generated from a mode selection signal generated by a circuit (not shown). The signal A<0> may be generated from the address signal of the true cell MC and the complement cell MC, which is generated by the decoder. The mode selection signal and the address signal are generated in accordance with a command from outside (for example, host). The inverter circuit 19A inverts the signal output from the NAND circuit 18A and outputs it as the read enable signal REN_A.

Similarly, the NAND circuit 18B performs a NAND operation between an inverted signal bA<0> of the signal A<0> and the activation signal ACT of "H" level output from the REN delay circuit 17, and outputs the operation result to the inverter circuit 19B. The inverter circuit 19B inverts the signal output from the NAND circuit 18B and outputs it as the read enable signal REN_B.

The NAND circuit 18C performs a NAND operation between a signal A<1> and the activation signal ACT of "H" level output from the REN delay circuit 17, and outputs the operation result to the inverter circuit 19C. The inverter circuit 19C inverts the signal output from the NAND circuit 18C and outputs it as the read enable signal REN_C.

The NAND circuit 18D performs a NAND operation between an inverted signal bA<1> of the signal A<1> and the activation signal ACT of "H" level output from the REN delay circuit 17, and outputs the operation result to the inverter circuit 19D. The inverter circuit 19D inverts the signal output from the NAND circuit 18D and outputs it as the read enable signal REN_D.

Figure 7:
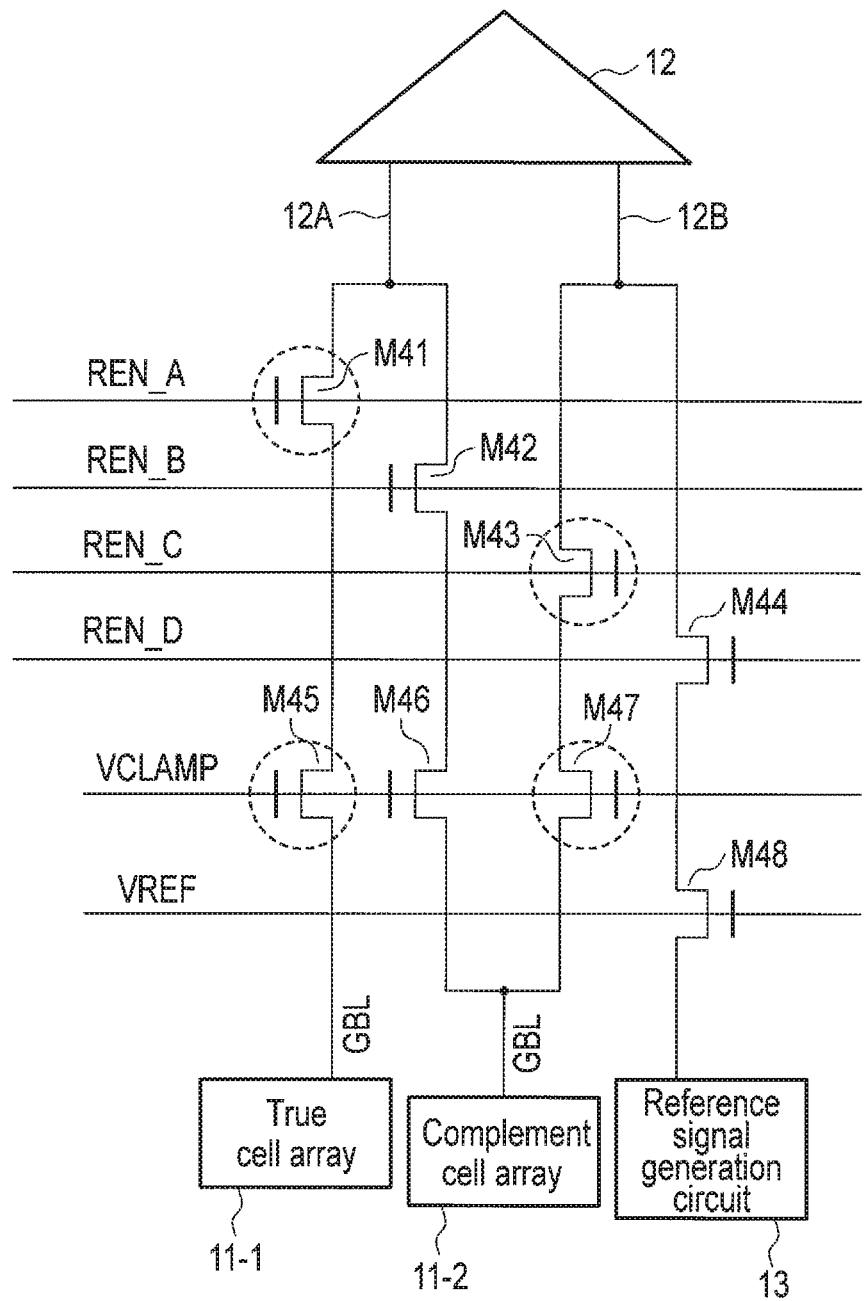
FIG. 7 is a circuit diagram showing the twin true cell operation of the true cell MC.

FIG. 4 is a table showing the truth values of operations by the REN control circuit 16. FIG. 5 is a circuit diagram showing the single cell operation of the complement cell MC (the single complement cell operation). FIG. 6 is a circuit diagram showing the single cell operation of the true cell MC (the single true cell operation). FIG. 7 is a circuit diagram showing the twin cell operation of the true cell MC (the twin true cell operation).

As shown in FIG. 4, in the single complement cell operation of the complement cell MC, the signals A<1> and A<0> are set to "L" level. Hence, the NAND circuits 18A and 18C output signals of "H" level, and the NAND circuits 18B and 18D output signals of "L" level. The inverter circuits 19A and 19C invert the signals of "H" level from the NAND circuits 18A and 18C and output signals of "L" level as the read enable signals REN_A and REN_C, respectively. On the other hand, the inverter circuits 19B and 19D invert the signals of "L" level from the NAND circuits 18B and 18D and output signals of "H" level as the read enable signals REN_B and REN_D, respectively. The clamp voltage generation circuit 15 outputs the clamp voltage signal VCLAMP of "M" level, and the reference signal control circuit 14 outputs the reference voltage signal VREF of "M" level.

As a result, the read enable transistors M42 and M44, the clamp transistor M46, and the reference transistor M48 are turned on, as shown in FIG. 5. The first complement path formed from the read enable transistor M42 and the clamp transistor M46 and the reference path formed from the read enable transistor M44 and the reference transistor M48 are thus rendered conductive. Hence, the complement cell array 11-2 and the first input terminal of the sense amplifier 12 are rendered conductive, and the reference signal generation circuit 13 and the second input terminal of the sense amplifier 12 are rendered conductive.

A complement cell signal (complement cell current or complement cell voltage) corresponding to data stored in the read target complement cell MC is generated from the complement cell array 11-2 to the first input terminal. On the other hand, a reference signal (reference current or reference voltage) having, for example, the intermediate value between "0" data and "1" data is generated from the reference signal generation circuit 13 to the second input terminal. The complement cell signal and the reference signal are compared, thereby reading data of the read target complement cell MC.

Referring back to FIG. 4, in the single true cell operation of the true cell MC, the signal A<1> is set to "L" level, and the signal A<0> is set to "H" level. Hence, the NAND circuits 18B and 18C output signals of "H" level, and the NAND circuits 18A and 18D output signals of "L" level. The inverter circuits 19B and 19C invert the signals of "H" level from the NAND circuits 18B and 18C and output signals of "L" level as the read enable signals REN_B and REN_C, respectively. On the other hand, the inverter circuits 19A and 19D invert the signals of "L" level from the NAND circuits 18A and 18D and output signals of "H" level as the read enable signals REN_A and REN_D, respectively. The clamp voltage generation circuit 15 outputs the clamp voltage signal VCLAMP of "M" level, and the reference signal control circuit 14 outputs the reference voltage signal VREF of "M" level.

As a result, the read enable transistors M41 and M44, the clamp transistor M45, and the reference transistor M48 are turned on, as shown in FIG. 6. The true path formed from the read enable transistor M41 and the clamp transistor M45 and the reference path formed from the read enable transistor M44 and the reference transistor M48 are thus rendered conductive. Hence, the true cell array 11-1 and the first input terminal of the sense amplifier 12 are rendered conductive, and the reference signal generation circuit 13 and the second input terminal of the sense amplifier 12 are rendered conductive.

A true cell signal (true cell current or true cell voltage) corresponding to data stored in the read target true cell MC is generated from the true cell array 11-1 to the first input terminal. On the other hand, a reference signal is generated from the reference signal generation circuit 13 to the second input terminal. The true cell signal and the reference signal are compared, thereby reading data of the read target true cell MC.

Referring back to FIG. 4, in the twin true cell operation of the true cell MC, the signals A<1> and A<0> are set to "H" level. Hence, the NAND circuits 18B and 18D output signals of "H" level, and the NAND circuits 18A and 18C output signals of "L" level. The inverter circuits 19B and 19D invert the signals of "H" level from the NAND circuits 18B and 18D and output signals of "L" level as the read enable signals REN_B and REN_D, respectively. On the other hand, the inverter circuits 19A and 19C invert the signals of "L" level from the NAND circuits 18A and 18C and output signals of "H" level as the read enable signals REN_A and REN_C, respectively. The clamp voltage generation circuit 15 outputs the clamp voltage signal VCLAMP of "M" level, and the reference signal control circuit 14 outputs the reference voltage signal VREF of "M" level.

As a result, the read enable transistors M41 and M43 and the clamp transistors M45 and M47 are turned on, as shown in FIG. 7. The true path formed from the read enable transistor M41 and the clamp transistor M45 and the second complement path formed from the read enable transistor M43 and the clamp transistor M47 are thus rendered conductive. Hence, the true cell array 11-1 and the first input terminal of the sense amplifier 12 are rendered conductive, and the complement cell array 11-2 and the second input terminal of the sense amplifier 12 are rendered conductive.

A true cell signal corresponding to data stored in the read target true cell MC is generated from the true cell array 11-1 to the first input terminal. On the other hand, a complement cell signal is generated from the complement cell array 11-2 to the second input terminal. At this time, the complement cell MC stores data (opposite data) complementing the read target true cell MC. For this reason, the complement cell signal is a signal (current or voltage) corresponding to the data complementing the true cell MC. The true cell signal and the complement cell signal are compared, thereby reading data of the read target true cell MC.

[Effects of First Embodiment]

According to the first embodiment, the true cell array 11-1, the complement cell array 11-2, and the reference signal generation circuit 13 are electrically connected to the sense amplifier 12 via the first to fourth series-connected elements (true path, first complement path, second complement path, and reference path) including switching elements. The REN control circuit 16 controls the read enable signals (sense amplifier activation signals) REN_A to REN_D, thereby controlling the conduction states of the first to fourth series-connected elements and switching between single cell read and twin cell read.

More specifically, the true cell array 11-1 or the complement cell array 11-2 and the first input terminal 12A of the sense amplifier 12 are rendered conductive, and the reference signal generation circuit 13 and the second input terminal 12B of the sense amplifier 12 are rendered conductive, thereby performing single cell read. The true cell array 11-1 and the first input terminal 12A of the sense amplifier 12 are rendered conductive, and the complement cell array 11-2 and the second input terminal 12B of the sense amplifier 12 are rendered conductive, thereby performing twin cell read. In this way, switching between single cell read and twin cell read can be implemented in the semiconductor memory device formed on a single chip.

Figure 8:
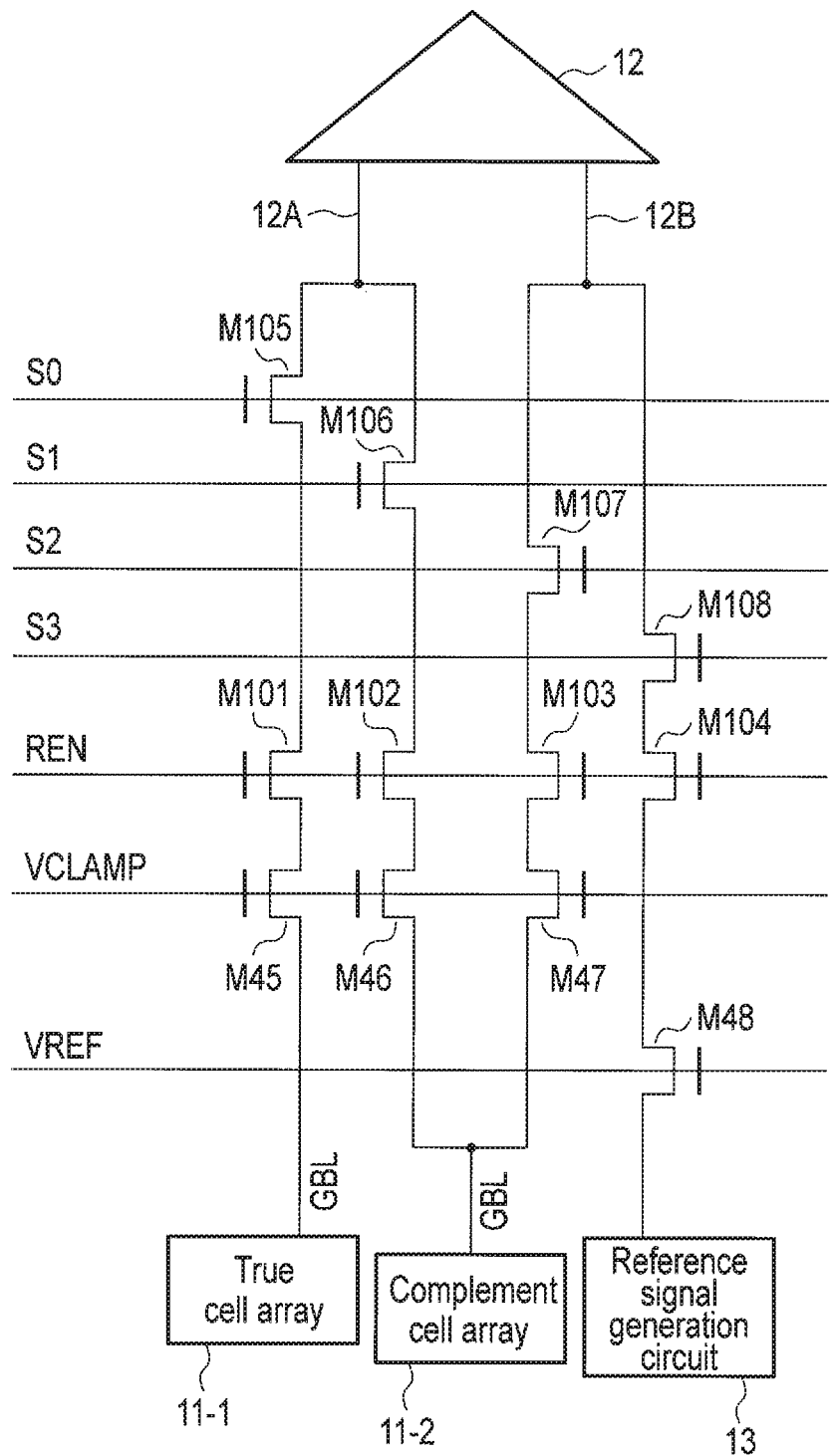
FIG. 8 is a circuit diagram showing the arrangement of a semiconductor memory device according to a comparative example.

On the other hand, as shown in FIG. 8, according to a comparative example, to implement switching between single cell read and twin cell read, nMOS transistors M105 to M108 to which new signals S0 to S3 are supplied are arranged in addition to the nMOS transistor M48 to which the reference voltage signal VREF is supplied, the nMOS transistors M45 to M47 to which the clamp voltage signal VCLAMP is supplied, and nMOS transistors M101 to M104 to which a read enable signal REN is supplied. In the comparative example, the signals S0 to S3 are controlled, thereby switching between single cell read and twin cell read.

For this reason, each of the first to fourth series-connected elements (true path, first complement path, second complement path, and reference path) is formed by connecting three transistors in series. As a result, an increase in the resistance by the transistors raises problems such as a decrease in the read speed caused by the increase in the resistance, degradation of the read margin caused by the increase in the resistance, degradation of the margin caused by variations between the switching elements, and an increase in the number of interconnections.

In the first embodiment, however, the nMOS transistors M41 to M44 to which the read enable signals REN_A to REN_D are supplied are controlled, thereby switching between single cell read and twin cell read. Hence, each series-connected element is formed by connecting two transistors (switching elements) in series. This can suppress the problems caused by an increase in the number of transistors as compared to the comparative example.

<Second Embodiment>

A semiconductor memory device according to the second embodiment will be described below with reference to FIGS. 9A, 9B, 10A, and 10B.

As described above, a clamp voltage signal VCLAMP and a reference voltage signal VREF are analog signals of "M" level. For this reason, when the clamp voltage signal VCLAMP and the reference voltage signal VREF are "M" level, a read operation error may occur due to the influence of coupling of adjacent interconnections. Normally, to avoid this problem, shield interconnections (VSS interconnections) are arranged as the adjacent interconnections of the interconnections of the clamp voltage signal VCLAMP and the reference voltage signal VREF. However, since the shield interconnections are needed as adjacent interconnections on both sides of each of the interconnections of the clamp voltage signal VCLAMP and the reference voltage signal VREF, the number of interconnections increases.

In the second embodiment, however, the interconnection layout of the first embodiment is changed, and one of the interconnections of inactive ("L" level) read enable signals REN_A to REN_D is used as one of the shield interconnections for the interconnections of the clamp voltage signal VCLAMP and the reference voltage signal VREF of "M" level which are analog signals. This makes it possible to decrease the number of VSS interconnections serving as the shield interconnections. The second embodiment will be described below in detail.

Note that in the second embodiment, a description of the same points as in the first embodiment will be omitted, and different points will mainly be described.

[Arrangement and Operation of Second Embodiment]

The arrangement and operation of the semiconductor memory device according to the second embodiment will be described with reference to FIGS. 9A, 9B, 10A, and 10B.

Figures 9A, 9B:
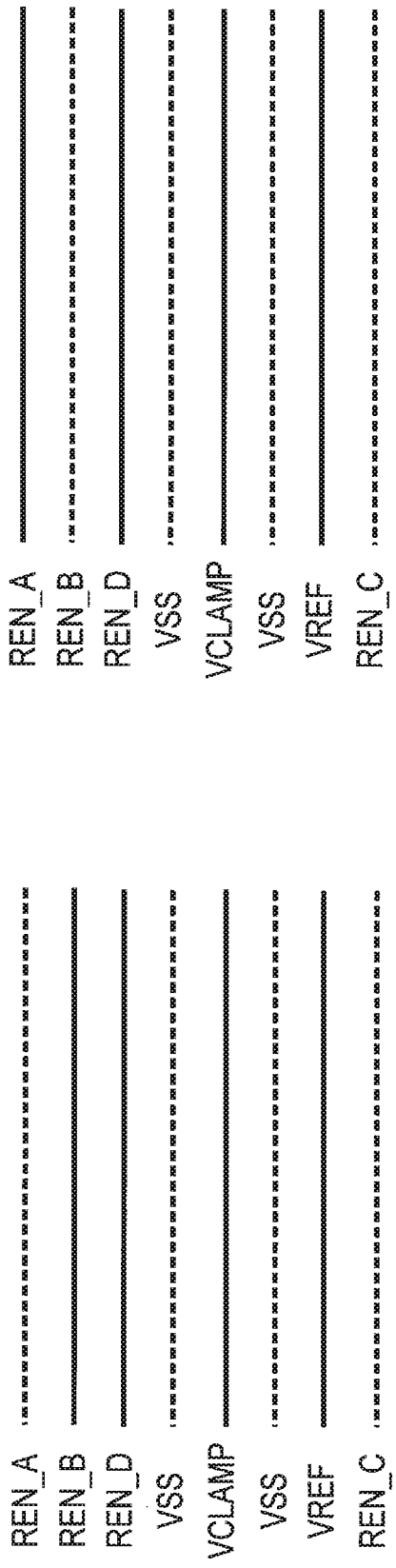
FIGS. 9A and 9B are views showing an example of the interconnection layout of a semiconductor memory device according to the second embodiment.

FIGS. 9A and 9B are views showing an example of the interconnection layout of the semiconductor memory device according to the second embodiment. More specifically, FIG. 9A shows the levels of signals in the single complement cell operation of a complement cell MC, and FIG. 9B shows the levels of signals in the single true cell operation of a true cell MC. A solid line represents "H" level or "M" level, and a broken line represents "L" level.

As shown in FIGS. 9A and 9B, the interconnections of the read enable signals REN_A to REN_D, the interconnection of the clamp voltage signal VCLAMP, the interconnection of the reference voltage signal VREF, a first VSS interconnection, and a second VSS interconnection are adjacently arranged in the same layer. They are arranged adjacently in the order of the interconnections of the read enable signals REN_A, REN_B, and REN_D, the first VSS interconnection, the interconnection of the clamp voltage signal VCLAMP, the second VSS interconnection, the interconnection of the reference voltage signal VREF, and the interconnection of the read enable signal REN_C.

More specifically, the interconnection of the clamp voltage signal VCLAMP is arranged between the first and second VSS interconnections serving as the shield interconnections. The interconnection of the reference voltage signal VREF is arranged between the second VSS interconnection serving as the shield interconnection and the interconnection of the read enable signal REN_C. In other words, the interconnection of the reference voltage signal VREF is adjacent to the second VSS interconnection serving as the shield interconnection on one side and adjacent to the interconnection of the read enable signal REN_C on the other side.

In the single cell operation of the complement cell MC and the true cell MC, the read enable signal REN_C is not activated and maintains "L" level. For this reason, the adjacent interconnection of the reference voltage signal VREF of "M" level is not affected by coupling of the interconnection of the read enable signal REN_C. Hence, the interconnection of the read enable signal REN_C functions as the shield interconnection for the interconnection of the reference voltage signal VREF of "M" level.

Figures 10A, 10B:
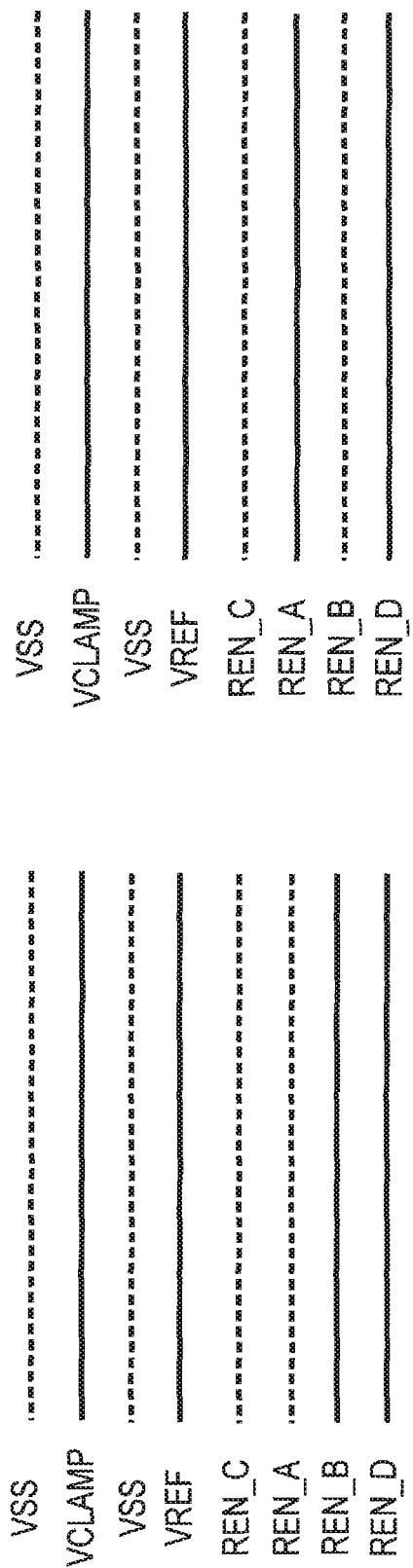
FIGS. 10A and 10B are views showing another example of the interconnection layout of the semiconductor memory device according to the second embodiment.

FIGS. 10A and 10B are views showing another example of the interconnection layout of the semiconductor memory device according to the second embodiment. More specifically, FIG. 10A shows the levels of signals in the single complement cell operation of the complement cell MC, and FIG. 10B shows the levels of signals in the single true cell operation of the true cell MC.

As shown in FIGS. 10A and 10B, the interconnections of the read enable signals REN_A to REN_D, the interconnection of the clamp voltage signal VCLAMP, the interconnection of the reference voltage signal VREF, the first VSS interconnection, and the second VSS interconnection are adjacently arranged in the same layer. They are arranged adjacently in the order of the first VSS interconnection, the interconnection of the clamp voltage signal VCLAMP, the second VSS interconnection, the interconnection of the reference voltage signal VREF, and the interconnection of the read enable signals REN_A, REN_B, REN_C, and REN_D.

More specifically, the interconnection of the clamp voltage signal VCLAMP is arranged between the first and second VSS interconnections serving as the shield interconnections. The interconnection of the reference voltage signal VREF is arranged between the second VSS interconnection serving as the shield interconnection and the interconnection of the read enable signal REN_C. In other words, the interconnection of the reference voltage signal VREF is adjacent to the second VSS interconnection serving as the shield interconnection on one side and adjacent to the interconnection of the read enable signal REN_C on the other side.

In another example as well, the interconnection of the read enable signal REN_C functions as the shield interconnection for the interconnection of the reference voltage signal VREF of "M" level.

Note that the embodiment is not limited to the above-described one and other examples, and the read enable signal REN_C need only functions as the shield interconnection for the interconnection of the clamp voltage signal VCLAMP of "M" level or the interconnection of the reference voltage signal VREF of "M" level. More specifically, the read enable signal REN_C need only be adjacent to one side or other side of the interconnection of the clamp voltage signal VCLAMP of "M" level or one side or other side of the interconnection of the reference voltage signal VREF of "M" level.

[Effects of Second Embodiment]

According to the second embodiment, the interconnection layout is changed, and one of the interconnections of the inactive ("L" level) read enable signals REN_A to REN_D is used as one of the shield interconnections for the interconnection of the clamp voltage signal VCLAMP and the interconnection of the reference voltage signal VREF, which supply analog signals ("M" level). More specifically, one of the interconnections of the read enable signals REN_A to REN_D of "L" level is laid out to be adjacent to the interconnection of the clamp voltage signal VCLAMP of "M" level or the interconnection of the reference voltage signal VREF of "M" level. This makes it possible to decrease the number of VSS interconnections serving as the shield interconnections.

<Third Embodiment>

A semiconductor memory device according to the third embodiment will be described below with reference to FIG. 11.

In the third embodiment, a first dummy path including the current paths of nMOS transistors M81 and M82 and a second dummy path including the current paths of nMOS transistors M83 and M84 are formed. This makes it possible to eliminate differences in the parasitic capacitance and parasitic resistance caused by an asymmetric current path structure and improve the read margin. The third embodiment will be described below in detail.

Note that in the third embodiment, a description of the same points as in the first embodiment will be omitted, and different points will mainly be described.

[Arrangement and Operation of Third Embodiment]

Figure 11:
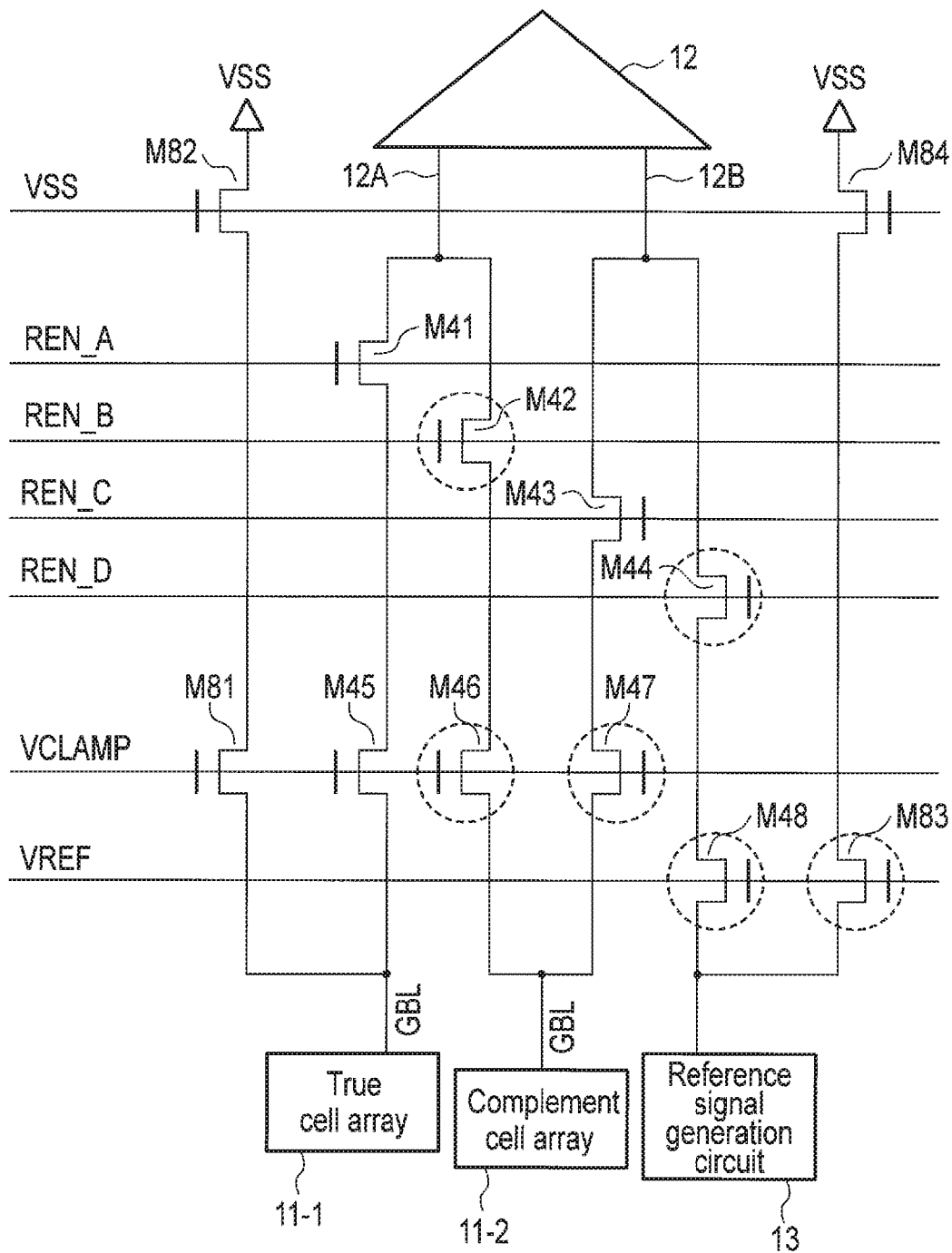
FIG. 11 is a circuit diagram showing the arrangement and operation of a semiconductor memory device according to the third embodiment.

FIG. 11 is a circuit diagram showing the arrangement and operation of the semiconductor memory device according to the third embodiment.

As shown in FIG. 11, the third embodiment is different from the first embodiment in that the first dummy path and the second dummy path are arranged.

A global bit line GBL in a true cell array 11-1 is electrically connected to a ground potential terminal VSS via a fifth series-connected element (first dummy path) including switching elements. More specifically, the global bit line GBL in the true cell array 11-1 is electrically connected to the ground potential terminal VSS via the fifth series-connected element including the clamp transistor M81 and the nMOS transistor M82 whose current paths are connected in series.

In other words, the global bit line GBL in the true cell array 11-1 is electrically connected to one end of the current path of the clamp transistor M81. The other end of the current path of the clamp transistor M81 is electrically connected to one end of the current path of the nMOS transistor M82. The other end of the current path of the nMOS transistor M82 is electrically connected to the ground potential terminal VSS.

A reference signal generation circuit 13 is electrically connected to the ground potential terminal VSS via a sixth series-connected element (second dummy path) including switching elements. More specifically, the reference signal generation circuit 13 is electrically connected to the ground potential terminal VSS via the sixth series-connected element including the reference transistor M83 and the nMOS transistor M84 whose current paths are connected in series.

In other words, the reference signal generation circuit 13 is electrically connected to one end of the current path of the reference transistor M83. The other end of the current path of the reference transistor M83 is electrically connected to one end of the current path of the nMOS transistor M84. The other end of the current path of the nMOS transistor M84 is electrically connected to the ground potential terminal VSS.

A clamp voltage generation circuit 15 supplies a clamp voltage signal VCLAMP to the gate of the clamp transistor M81. A reference signal control circuit 14 supplies a reference voltage signal VREF to the gate of the reference transistor M83. The voltage VSS is applied to the gates of the nMOS transistors M82 and M84. That is, the nMOS transistors M82 and M84 are always off.

As shown in FIG. 11, in the single complement cell operation of a complement cell MC, a clamp transistor M47 to which the clamp voltage signal VCLAMP is supplied is turned on. A complement cell array 11-2 is thus rendered conductive not only to a first complement path formed from a read enable transistor M42 and a clamp transistor M46 but also to part of a second complement path including the clamp transistor M47.

On the other hand, in the single complement cell operation of the complement cell MC, the reference transistor M83 to which the reference voltage signal VREF is supplied is turned on. The reference signal generation circuit 13 is thus rendered conductive not only to a reference path formed from a read enable transistor M44 and a reference transistor M48 but also to part of the second dummy path including the reference transistor M83.

As described above, in the single complement cell operation of the complement cell MC, the current path conductive to the reference signal generation circuit 13 and the current path conductive to the complement cell array 11-2 become symmetric (identical). This makes it possible to suppress degradation of the read margin.

Although not illustrated, in the twin true cell operation of the true cell MC, the clamp transistor M46 to which the clamp voltage signal VCLAMP is supplied is turned on. The complement cell array 11-2 is thus rendered conductive not only to the second complement path formed from a read enable transistor M43 and the clamp transistor M47 but also to part of the first complement path including the clamp transistor M46.

On the other hand, in the twin true cell operation of the true cell MC, the clamp transistor M81 to which the clamp voltage signal VCLAMP is supplied is turned on. The true cell array 11-1 is thus rendered conductive not only to a true path formed from a read enable transistor M41 and a clamp transistor M45 but also to part of the first dummy path including the clamp transistor M81.

As described above, in the twin true cell operation of the true cell MC, the current path conductive to the true cell array 11-1 and the current path conductive to the complement cell array 11-2 become symmetric (identical). This makes it possible to suppress degradation of the read margin.

[Effects of Third Embodiment]

In the single complement cell operation of the complement cell MC, the clamp transistor M47 to which the clamp voltage signal VCLAMP is supplied is turned on. The complement cell array 11-2 is thus rendered conductive not only to the first complement path formed from the read enable transistor M42 and the clamp transistor M46 but also to part of the second complement path including the clamp transistor M47. For this reason, when the reference signal generation circuit 13 is rendered conductive only to the reference path formed from the reference transistor M48 and the read enable transistor M44, the current path conductive to the reference signal generation circuit 13 and that conductive to the complement cell array 11-2 are different (asymmetric). This generates differences in the parasitic capacitance and parasitic resistance and degrades the read margin.

According to the third embodiment, however, the second dummy path formed from the current paths of the nMOS transistors M83 and M84 is arranged. In the single complement cell operation of the complement cell MC, the reference signal generation circuit 13 is rendered conducive not only to the reference path but also to part of the second dummy path including the reference transistor M83. That is, the current path conductive to the reference signal generation circuit 13 and that conductive to the complement cell array 11-2 can be made symmetric. It is therefore possible to eliminate the differences in the parasitic capacitance and parasitic resistance between the current paths and improve the read margin.

The same effect as described above can also be obtained in the twin true cell operation of the true cell MC. That is, the current path (part of the first complement path and the second complement path) conductive to the complement cell array 11-2 and the current path (the true path and part of the first dummy path) conductive to the true cell array 11-1 can be made symmetric.

<Fourth Embodiment>

A semiconductor memory device according to the fourth embodiment will be described below with reference to FIGS. 12 and 13. In the fourth embodiment, a clamp voltage generation circuit 15 and a reference signal control circuit 14 control the analog signals of clamp voltage signals VCLAMP_A to VCLAMP_C and a reference voltage signal VREF, respectively. This makes it possible to do switching between single cell read and twin cell read by controlling conduction of series-connected elements. The fourth embodiment will be described below in detail.

[Arrangement and Operation of Fourth Embodiment]

FIG. 12 is a circuit diagram showing the arrangement and operation of the semiconductor memory device according to the fourth embodiment.

As shown in FIG. 12, the fourth embodiment is different from the first embodiment in that switching between single cell read and twin cell read is performed not by a read enable signal REN but by the clamp voltage signals VCLAMP_A to VCLAMP_C and the reference voltage signal VREF.

A global bit line GBL in a true cell array 11-1 is electrically connected to a first input terminal 12A of a sense amplifier 12 via a first series-connected element (true path) including a clamp transistor M55 and a read enable transistor M51 whose current paths are connected in series. In other words, the global bit line GBL in the true cell array 11-1 is electrically connected to one end of the current path of the clamp transistor M55. The other end of the current path of the clamp transistor M55 is electrically connected to one end of the current path of the read enable transistor M51. The other end of the current path of the read enable transistor M51 is electrically connected to the first input terminal 12A of the sense amplifier 12.

The global bit line GBL in a complement cell array 11-2 is electrically connected to the first input terminal 12A of the sense amplifier 12 via a second series-connected element (first complement path) including a clamp transistor M56 and a read enable transistor M52 whose current paths are connected in series. In other words, the global bit line GBL in the complement cell array 11-2 is electrically connected to one end of the current path of the clamp transistor M56. The other end of the current path of the clamp transistor M56 is electrically connected to one end of the current path of the read enable transistor M52. The other end of the current path of the read enable transistor M52 is electrically connected to the first input terminal 12A of the sense amplifier 12.

The global bit line GBL in the complement cell array 11-2 is also electrically connected to a second input terminal 12B of the sense amplifier 12 via a third series-connected element (second complement path) including a clamp transistor M57 and a read enable transistor M53 whose current paths are connected in series. In other words, the global bit line GBL in the complement cell array 11-2 is electrically connected to one end of the current path of the clamp transistor M57. The other end of the current path of the clamp transistor M57 is electrically connected to one end of the current path of the read enable transistor M53. The other end of the current path of the read enable transistor M53 is electrically connected to the second input terminal 12B of the sense amplifier 12.

A reference signal generation circuit 13 is electrically connected to the second input terminal of the sense amplifier 12 via a fourth series-connected element (reference path) including a reference transistor M58 and a read enable transistor M54 whose current paths are connected in series. In other words, the reference signal generation circuit 13 is electrically connected to one end of the current path of the reference transistor M58. The other end of the current path of the reference transistor M58 is electrically connected to one end of the current path of the read enable transistor M54. The other end of the current path of the read enable transistor M54 is electrically connected to the second input terminal 12B of the sense amplifier 12.

A REN control circuit 16 supplies the read enable signal REN to the gates of the read enable transistors M51 to M54. Different clamp voltage generation circuits 15 supply the clamp voltage signals VCLAMP_A to VCLAMP_C to the gates of the clamp transistors M55 to M57, respectively. The reference signal control circuit 14 supplies the reference voltage signal VREF to the gate of the reference transistor M58.

FIG. 13 is a table showing the truth values of operations by the clamp voltage generation circuit 15 and the reference signal control circuit 14.

As shown in FIG. 13, in the single complement cell operation of a complement cell MC, the clamp voltage generation circuits 15 output the clamp voltage signal VCLAMP_A of "L" level, the clamp voltage signal VCLAMP_B of "M" level, and the clamp voltage signal VCLAMP_C of "L" level. The reference signal control circuit 14 outputs the reference voltage signal VREF of "M" level. The REN control circuit 16 outputs the read enable signal REN of "H" level.

As a result, the read enable transistors M52 and M54, the clamp transistor M56, and the reference transistor M58 are turned on. The first complement path formed from the read enable transistor M52 and the clamp transistor M56 and the reference path formed from the read enable transistor M54 and the reference transistor M58 are thus rendered conductive. Hence, the complement cell array 11-2 and the first input terminal of the sense amplifier 12 are electrically connected, and the reference signal generation circuit 13 and the second input terminal of the sense amplifier 12 are electrically connected. The data of the read target complement cell MC can be read in this way.

In the single true cell operation of the true cell MC, the clamp voltage generation circuits 15 output the clamp voltage signal VCLAMP_A of "M" level, the clamp voltage signal VCLAMP_B of "L" level, and the clamp voltage signal VCLAMP_C of "L" level. The reference signal control circuit 14 outputs the reference voltage signal VREF of "M" level. The REN control circuit 16 outputs the read enable signal REN of "H" level.

As a result, the read enable transistors M51 and M54, the clamp transistor M55, and the reference transistor M58 are turned on. The true path formed from the read enable transistor M51 and the clamp transistor M55 and the reference path formed from the read enable transistor M54 and the reference transistor M58 are thus rendered conductive. Hence, the true cell array 11-1 and the first input terminal of the sense amplifier 12 are electrically connected, and the reference signal generation circuit 13 and the second input terminal of the sense amplifier 12 are electrically connected. The data of the read target true cell MC can be read in this way.

In the twin true cell operation of the true cell MC, the clamp voltage generation circuits 15 output the clamp voltage signal VCLAMP_A of "M" level, the clamp voltage signal VCLAMP_B of "L" level, and the clamp voltage signal VCLAMP_C of "M" level. The reference signal control circuit 14 outputs the reference voltage signal VREF of "L" level. The REN control circuit 16 outputs the read enable signal REN of "H" level.

As a result, the read enable transistors M51 and M53 and the clamp transistors M55 and M57 are turned on. The true path formed from the read enable transistor M51 and the clamp transistor M55 and the second complement path formed from the read enable transistor M53 and the clamp transistor M57 are thus rendered conductive. Hence, the true cell array 11-1 and the first input terminal of the sense amplifier 12 are electrically connected, and the complement cell array 11-2 and the second input terminal of the sense amplifier 12 are electrically connected. The data of the read target true cell MC can be read in this way.

[Effects of Fourth Embodiment]

According to the fourth embodiment, the clamp voltage generation circuits 15 and the reference signal control circuit 14 control the analog signals of the clamp voltage signals VCLAMP_A to VCLAMP_C and the reference voltage signal VREF. This makes it possible to obtain the same effects as in the first embodiment.

<Fifth Embodiment>

A semiconductor memory device according to the fifth embodiment will be described below with reference to FIGS. 14A, 14B, and 14C.

In the fifth embodiment, the interconnection layout of the fourth embodiment is changed, and some of the interconnections of inactive ("L" level) clamp voltage signals VCLAMP_A to VCLAMP_C and reference voltage signal VREF are used as some of shield interconnections for the interconnections of the clamp voltage signals VCLAMP_A to VCLAMP_C and the reference voltage signal VREF of "M" level which are analog signals. This makes it possible to decrease the number of VSS interconnections serving as the shield interconnections. The fifth embodiment will be described below in detail.

Note that in the fifth embodiment, a description of the same points as in the fourth embodiment will be omitted, and different points will mainly be described.

[Arrangement and Operation of Fifth Embodiment]

The arrangement and operation of the semiconductor memory device according to the fifth embodiment will be described with reference to FIGS. 14A, 14B, and 14C.

Figures 14A, 14B, 14C:
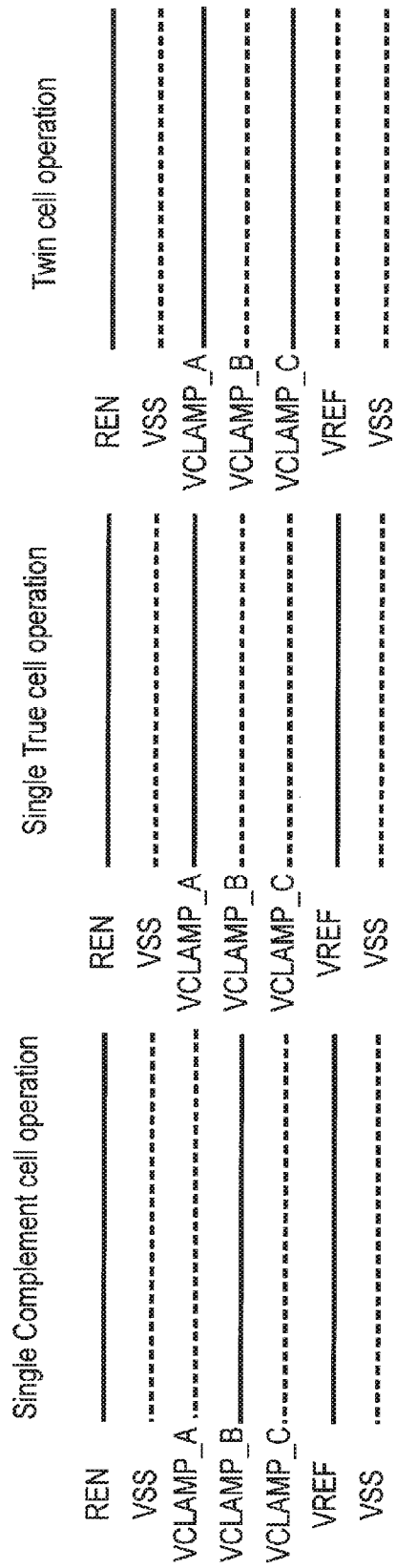
FIGS. 14A, 14B, and 14C are views showing an example of the interconnection layout of a semiconductor memory device according to the fifth embodiment.

FIGS. 14A, 14B, and 14C are views showing an example of the interconnection layout of the semiconductor memory device according to the fifth embodiment. More specifically, FIG. 14A shows the levels of signals in the single complement cell operation of a complement cell MC, FIG. 14B shows the levels of signals in the single true cell operation of a true cell MC, and FIG. 14C shows the levels of signals in the twin true cell operation of the true cell MC. A solid line represents "H" level or "M" level, and a broken line represents "L" level.

As shown in FIGS. 14A, 14B, and 14C, the interconnection of a read enable signal REN, the interconnections of the clamp voltage signals VCLAMP_A to VCLAMP_C, the interconnection of the reference voltage signal VREF, a first VSS interconnection, and a second VSS interconnection are adjacently arranged in the same layer. They are arranged adjacently in the order of the interconnection of the read enable signal REN, the first VSS interconnection, the interconnections of the clamp voltage signals VCLAMP_A to VCLAMP_C, the interconnection of the reference voltage signal VREF, and the second VSS interconnection.

As shown in FIG. 14A, in the single complement cell operation of the complement cell MC, the clamp voltage signals VCLAMP_A and VCLAMP_C are not activated and maintain "L" level. For this reason, the interconnection of the clamp voltage signal VCLAMP_B of "M" level and the interconnection of the reference voltage signal VREF of "M" level, which are adjacent to the interconnections, are not affected by coupling of the interconnections of the clamp voltage signals VCLAMP_A and VCLAMP_C. Hence, the interconnections of the clamp voltage signals VCLAMP_A and VCLAMP_C function as the shield interconnections for the interconnection of the clamp voltage signal VCLAMP_B of "M" level and the interconnection of the reference voltage signal VREF of "M" level.

As shown in FIG. 14B, in the single true cell operation of the true cell MC, the clamp voltage signals VCLAMP_B and VCLAMP_C are not activated and maintain "L" level. For this reason, the interconnection of the clamp voltage signal VCLAMP_A of "M" level and the interconnection of the reference voltage signal VREF of "M" level, which are adjacent to the interconnections, are not affected by coupling of the interconnections of the clamp voltage signals VCLAMP_B and VCLAMP_C. Hence, the interconnections of the clamp voltage signals VCLAMP_B and VCLAMP_C function as the shield interconnections for the interconnection of the clamp voltage signal VCLAMP_A of "M" level and the interconnection of the reference voltage signal VREF of "M" level.

As shown in FIG. 14C, in the twin true cell operation of the true cell MC, the clamp voltage signal VCLAMP_B and the reference voltage signal VREF are not activated and maintain "L" level. For this reason, the interconnections of the clamp voltage signals VCLAMP_A and VCLAMP_C of "M" level, which are adjacent to the interconnections, are not affected by coupling of the interconnection of the clamp voltage signal VCLAMP_B and the interconnection of the reference voltage signal VREF. Hence, the interconnection of the clamp voltage signal VCLAMP_B and the interconnection of the reference voltage signal VREF function as the shield interconnections for the interconnections of the clamp voltage signals VCLAMP_A and VCLAMP_C of "M" level.

[Effects of Fifth Embodiment]

According to the fifth embodiment, the interconnection layout is changed, and some of the interconnections of the inactive ("L" level) clamp voltage signals VCLAMP_A to VCLAMP_C and reference voltage signal VREF are used as some of the shield interconnections for the interconnections of the clamp voltage signals VCLAMP_A to VCLAMP_C and the reference voltage signal VREF of "M" level which are analog signals. More specifically, some of the interconnections of the clamp voltage signals VCLAMP_A to VCLAMP_C and reference voltage signal VREF of "L" level are laid out to be adjacent to the interconnections of the clamp voltage signals VCLAMP_A to VCLAMP_C of "M" level and the interconnection of the reference voltage signal VREF of "M" level. This makes it possible to decrease the number of VSS interconnections serving as the shield interconnections.

<Sixth Embodiment>

A semiconductor memory device according to the sixth embodiment will be described below with reference to FIGS. 15 and 16. In the sixth embodiment, the first embodiment and the fourth embodiment are combined. More specifically, a REN control circuit 16 controls read enable signals REN_A to REN_C, and a clamp voltage generation circuit 15 and a reference signal control circuit 14 control the analog signals of clamp voltage signals VCLAMP_A and VCLAMP_B and a reference voltage signal VREF, respectively. This makes it possible to do switching between single cell read and twin cell read by controlling conduction of series-connected elements. The sixth embodiment will be described below in detail.

[Arrangement and Operation of Sixth Embodiment]

Figure 15:
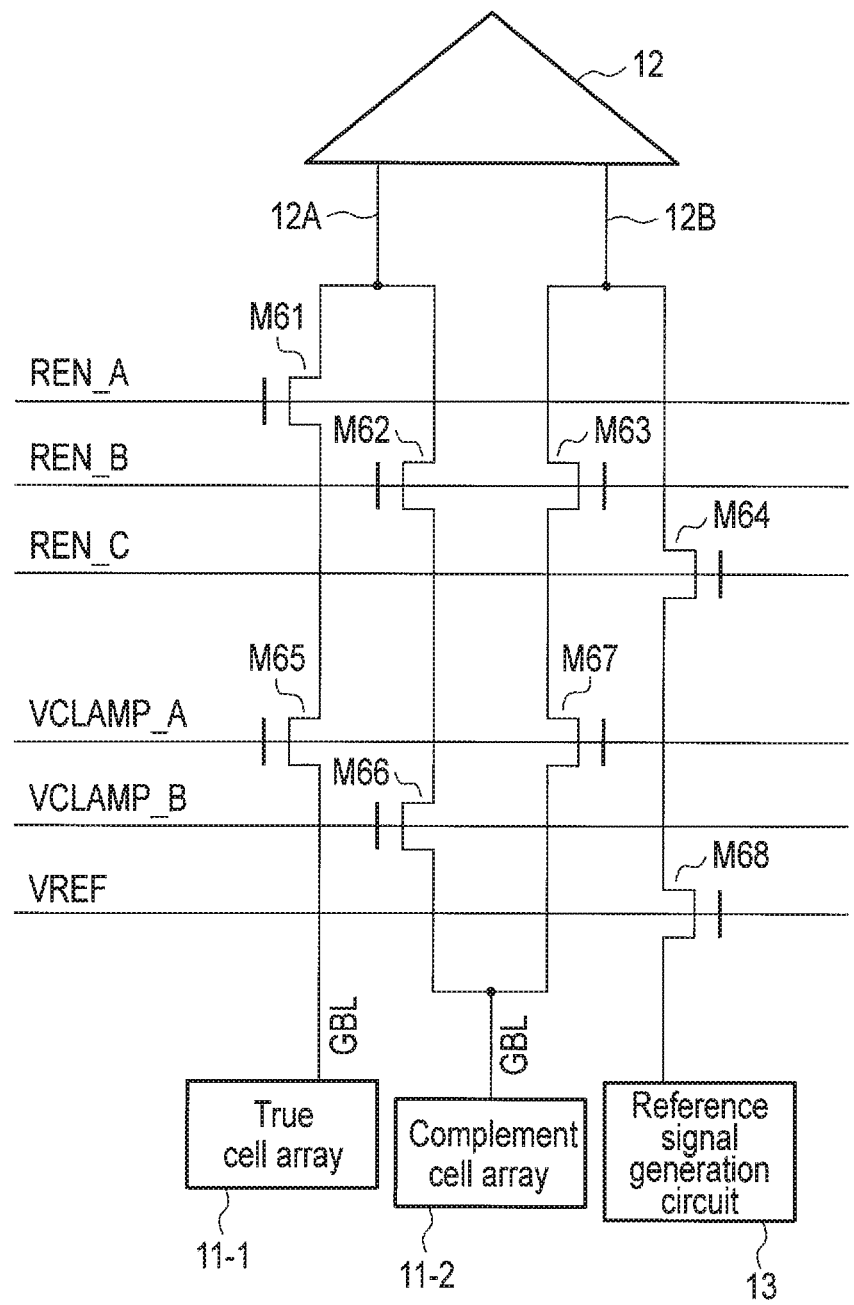
FIG. 15 is a circuit diagram showing the arrangement and operation of a semiconductor memory device according to the sixth embodiment.

FIG. 15 is a circuit diagram showing the arrangement and operation of the semiconductor memory device according to the sixth embodiment.

As shown in FIG. 15, the sixth embodiment is different from the first embodiment in that switching between single cell read and twin cell read is performed by the read enable signals REN_A to REN_C, the clamp voltage signals VCLAMP_A and VCLAMP_B, and the reference voltage signal VREF.

A global bit line GBL in a true cell array 11-1 is electrically connected to a first input terminal 12A of a sense amplifier 12 via a first series-connected element (true path) including a clamp transistor M65 and a read enable transistor M61 whose current paths are connected in series. In other words, the global bit line GBL in the true cell array 11-1 is electrically connected to one end of the current path of the clamp transistor M65. The other end of the current path of the clamp transistor M65 is electrically connected to one end of the current path of the read enable transistor M61. The other end of the current path of the read enable transistor M61 is electrically connected to the first input terminal 12A of the sense amplifier 12.

The global bit line GBL in a complement cell array 11-2 is electrically connected to the first input terminal 12A of the sense amplifier 12 via a second series-connected element (first complement path) including a clamp transistor M66 and a read enable transistor M62 whose current paths are connected in series. In other words, the global bit line GBL in the complement cell array 11-2 is electrically connected to one end of the current path of the clamp transistor M66. The other end of the current path of the clamp transistor M66 is electrically connected to one end of the current path of the read enable transistor M62. The other end of the current path of the read enable transistor M62 is electrically connected to the first input terminal 12A of the sense amplifier 12.

The global bit line GBL in the complement cell array 11-2 is also electrically connected to a second input terminal 12B of the sense amplifier 12 via a third series-connected element (second complement path) including a clamp transistor M67 and a read enable transistor M63 whose current paths are connected in series. In other words, the global bit line GBL in the complement cell array 11-2 is electrically connected to one end of the current path of the clamp transistor M67. The other end of the current path of the clamp transistor M67 is electrically connected to one end of the current path of the read enable transistor M63. The other end of the current path of the read enable transistor M63 is electrically connected to the second input terminal 12B of the sense amplifier 12.

A reference signal generation circuit 13 is electrically connected to the second input terminal of the sense amplifier 12 via a fourth series-connected element (reference path) including a reference transistor M68 and a read enable transistor M64 whose current paths are connected in series. In other words, the reference signal generation circuit 13 is electrically connected to one end of the current path of the reference transistor M68. The other end of the current path of the reference transistor M68 is electrically connected to one end of the current path of the read enable transistor M64. The other end of the current path of the read enable transistor M64 is electrically connected to the second input terminal 12B of the sense amplifier 12.

The REN control circuit 16 supplies the read enable signal REN_A to the gate of the read enable transistor M61, the read enable signal REN_B to the gates of the read enable transistors M62 and M63, and the read enable signal REN_C to the gate of the read enable transistor M64. Different clamp voltage generation circuits 15 supply the clamp voltage signal VCLAMP_A to the gates of the clamp transistors M65 and M67, and the clamp voltage signal VCLAMP_B to the gate of the clamp transistor M66. The reference signal control circuit 14 supplies the reference voltage signal VREF to the gate of the reference transistor M68.

FIG. 16 is a table showing the truth values of operations by the REN control circuit 16, the clamp voltage generation circuit 15, and the reference signal control circuit 14.

As shown in FIG. 16, in the single complement cell operation of a complement cell MC, the clamp voltage generation circuits 15 output the clamp voltage signal VCLAMP_A of "L" level and the clamp voltage signal VCLAMP_B of "M" level. The reference signal control circuit 14 outputs the reference voltage signal VREF of "M" level. The REN control circuit 16 outputs the read enable signal REN_A of "L" level, the read enable signal REN_B of "H" level, and the read enable signal REN_C of "H" level.

As a result, the read enable transistors M62 and M64, the clamp transistor M66, and the reference transistor M68 are turned on. The first complement path formed from the read enable transistor M62 and the clamp transistor M66 and the reference path formed from the read enable transistor M64 and the reference transistor M68 are thus rendered conductive. Hence, the complement cell array 11-2 and the first input terminal of the sense amplifier 12 are electrically connected, and the reference signal generation circuit 13 and the second input terminal of the sense amplifier 12 are electrically connected. The data of the read target complement cell MC can be read in this way.

In the single true cell operation of the true cell MC, the clamp voltage generation circuits 15 output the clamp voltage signal VCLAMP_A of "M" level and the clamp voltage signal VCLAMP_B of "L" level. The reference signal control circuit 14 outputs the reference voltage signal VREF of "M" level. The REN control circuit 16 outputs the read enable signal REN_A of "H" level, the read enable signal REN_B of "L" level, and the read enable signal REN_C of "H" level.

As a result, the read enable transistors M61 and M64, the clamp transistor M65, and the reference transistor M68 are turned on. The true path formed from the read enable transistor M61 and the clamp transistor M65 and the reference path formed from the read enable transistor M64 and the reference transistor M68 are thus rendered conductive. Hence, the true cell array 11-1 and the first input terminal of the sense amplifier 12 are electrically connected, and the reference signal generation circuit 13 and the second input terminal of the sense amplifier 12 are electrically connected. The data of the read target true cell MC can be read in this way.

In the twin true cell operation of the true cell MC, the clamp voltage generation circuits 15 output the clamp voltage signal VCLAMP_A of "M" level and the clamp voltage signal VCLAMP_B of "L" level. The reference signal control circuit 14 outputs the reference voltage signal VREF of "L" level. The REN control circuit 16 outputs the read enable signal REN_A of "H" level, the read enable signal REN_B of "H" level, and the read enable signal REN_C of "L" level.

As a result, the read enable transistors M61 and M63 and the clamp transistors M65 and M67 are turned on. The true path formed from the read enable transistor M61 and the clamp transistor M65 and the second complement path formed from the read enable transistor M63 and the clamp transistor M67 are thus rendered conductive. Hence, the true cell array 11-1 and the first input terminal of the sense amplifier 12 are electrically connected, and the complement cell array 11-2 and the second input terminal of the sense amplifier 12 are electrically connected. The data of the read target true cell MC can be read in this way.

[Effects of Sixth Embodiment]

According to the sixth embodiment, the REN control circuit 16 controls the read enable signals REN_A to REN_C, and the clamp voltage generation circuit 15 and the reference signal control circuit 14 control the analog signals of the clamp voltage signals VCLAMP_A and VCLAMP_B and the reference voltage signal VREF, respectively. This makes it possible to obtain the same effects as in the first embodiment.

Note that as shown in FIG. 17, the REN control circuit 16 may control the read enable signals REN_A to REN_D, and the clamp voltage generation circuit 15 and the reference signal control circuit 14 may control the analog signals of the clamp voltage signals VCLAMP_A to VCLAMP_C and the reference voltage signal VREF, respectively.

In this case, the first series-connected element (true path) includes a clamp transistor M75 and a read enable transistor M71 whose current paths are connected in series. The second series-connected element (first complement path) includes a clamp transistor M76 and a read enable transistor M72 whose current paths are connected in series. The third series-connected element (second complement path) includes a clamp transistor M77 and a read enable transistor M73 whose current paths are connected in series. The fourth series-connected element (reference path) includes a reference transistor M78 and a read enable transistor M74 whose current paths are connected in series.

The REN control circuit 16 supplies the read enable signal REN_A to the gate of the read enable transistor M71, the read enable signal REN_B to the gate of the read enable transistor M72, the read enable signal REN_C to the gate of the read enable transistor M73, and the read enable signal REN_D to the gate of the read enable transistor M74. Different clamp voltage generation circuits 15 supply the clamp voltage signal VCLAMP_A to the gate of the clamp transistor M75, the clamp voltage signal VCLAMP_B to the gate of the clamp transistor M76, and the clamp voltage signal VCLAMP_C to the gate of the clamp transistor M77. The reference signal control circuit 14 supplies the reference voltage signal VREF to the gate of the reference transistor M78.

<Seventh Embodiment>

A semiconductor memory device according to the seventh embodiment will be described below with reference to FIGS. 18A, 18B, and 18C.

In the seventh embodiment, the interconnection layout of the sixth embodiment is changed, and one of the interconnections of inactive ("L" level) clamp voltage signals VCLAMP_A and VCLAMP_B is used as one of shield interconnections for the other of the interconnections of the clamp voltage signals VCLAMP_A and VCLAMP_B of "M" level which are analog signals. This makes it possible to decrease the number of VSS interconnections serving as the shield interconnections. The seventh embodiment will be described below in detail.

Note that in the seventh embodiment, a description of the same points as in the sixth embodiment will be omitted, and different points will mainly be described.

[Arrangement and Operation of Seventh Embodiment]

The arrangement and operation of the semiconductor memory device according to the seventh embodiment will be described with reference to FIGS. 18A, 18B, and 18C.

Figures 18A, 18B, 18C:
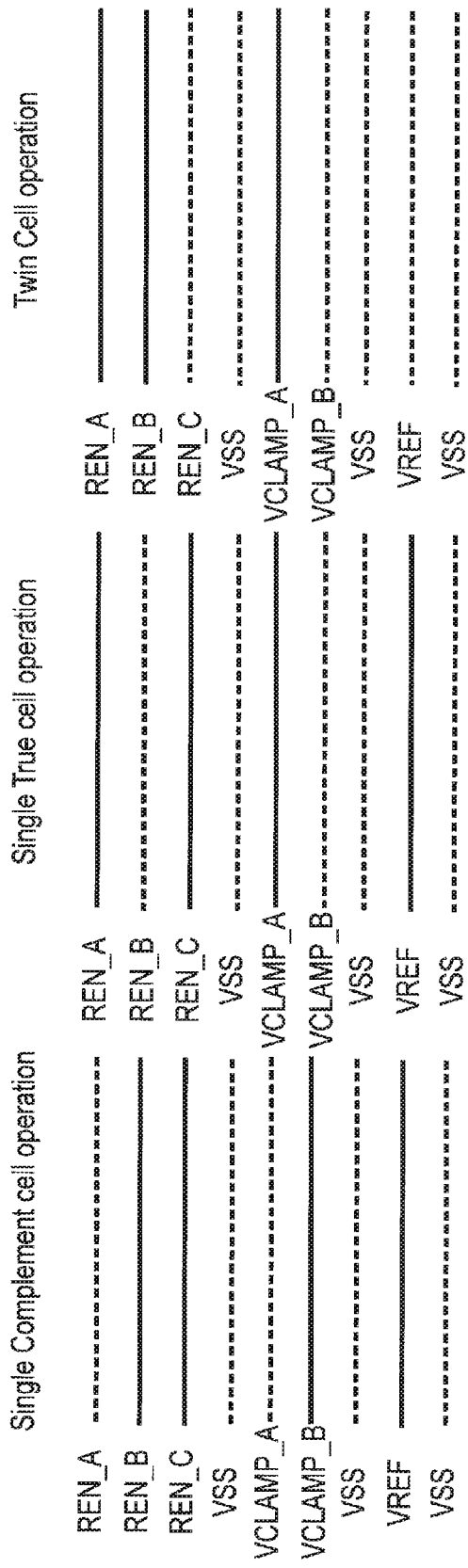
FIGS. 18A, 18B, and 18C are views showing an example of the interconnection layout of a semiconductor memory device according to the seventh embodiment.

FIGS. 18A, 18B, and 18C are views showing an example of the interconnection layout of the semiconductor memory device according to the seventh embodiment. More specifically, FIG. 18A shows the levels of signals in the single complement cell operation of a complement cell MC, FIG. 18B shows the levels of signals in the single true cell operation of a true cell MC, and FIG. 18C shows the levels of signals in the twin true cell operation of the true cell MC. A solid line represents "H" level or "M" level, and a broken line represents "L" level.

As shown in FIGS. 18A, 18B, and 18C, the interconnections of read enable signals REN_A to REN_C, the interconnections of the clamp voltage signals VCLAMP_A and VCLAMP_B, the interconnection of a reference voltage signal VREF, a first VSS interconnection, a second VSS interconnection, and a third VSS interconnection are adjacently arranged in the same layer. They are arranged adjacently in the order of the interconnections of the read enable signals REN_A to REN_C, the first VSS interconnection, the interconnections of the clamp voltage signals VCLAMP_A and VCLAMP_B, the second VSS interconnection, the interconnection of the reference voltage signal VREF, and the third VSS interconnection.

As shown in FIG. 18A, in the single complement cell operation of the complement cell MC, the clamp voltage signal VCLAMP_A is not activated and maintains "L" level. For this reason, the adjacent interconnection of the clamp voltage signal VCLAMP_B of "M" level is not affected by coupling of the interconnection of the clamp voltage signal VCLAMP_A. Hence, the interconnection of the clamp voltage signal VCLAMP_A functions as the shield interconnection for the interconnection of the clamp voltage signal VCLAMP_B of "M" level.

As shown in FIG. 18B, in the single true cell operation of the true cell MC, the clamp voltage signal VCLAMP_B is not activated and maintains "L" level. For this reason, the adjacent interconnection of the clamp voltage signal VCLAMP_A of "M" level is not affected by coupling of the interconnection of the clamp voltage signal VCLAMP_B. Hence, the interconnection of the clamp voltage signal VCLAMP_B functions as the shield interconnection for the interconnection of the clamp voltage signal VCLAMP_A of "M" level.

As shown in FIG. 18C, in the twin true cell operation of the true cell MC, the clamp voltage signal VCLAMP_B is not activated and maintains "L" level. For this reason, the adjacent interconnection of the clamp voltage signal VCLAMP_A of "M" level is not affected by coupling of the interconnection of the clamp voltage signal VCLAMP_B. Hence, the interconnection of the clamp voltage signal VCLAMP_B functions as the shield interconnection for the interconnection of the clamp voltage signal VCLAMP_A of "M" level.

[Effects of Seventh Embodiment]

According to the seventh embodiment, the interconnection layout is changed, and one of the interconnections of the inactive ("L" level) clamp voltage signals VCLAMP_A and VCLAMP_B is used as one of the shield interconnections for the other of the interconnections of the clamp voltage signals VCLAMP_A and VCLAMP_B of "M" level which are analog signals. More specifically, one of the interconnections of the clamp voltage signals VCLAMP_A and VCLAMP_B of "L" level is laid out to be adjacent to the other of the interconnections of the clamp voltage signals VCLAMP_A and VCLAMP_B of "M" level. This makes it possible to decrease the number of VSS interconnections serving as the shield interconnections.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A semiconductor memory device comprising:
a first memory cell having a variable resistive element and electrically connected to a first bit line;
a second memory cell having a variable resistive element and electrically connected to a second bit line;
a reference signal generation circuit which generates a reference signal;
a sense amplifier having a first input terminal and a second input terminal; and
a read enable control circuit which generates a read enable signal in accordance with a command from outside and controls switching between a single cell read mode and a twin cell read mode by controlling connections of the first and second bit lines with the sense amplifier.

2. The device of claim 1, further comprising:
a first series-connected element which includes a first switching element and electrically connects the first memory cell and the first input terminal of the sense amplifier;
a second series-connected element which includes a second switching element and electrically connects the second memory cell and the first input terminal of the sense amplifier;
a third series-connected element which includes a third switching element and electrically connects the second memory cell and the second input terminal of the sense amplifier; and
a fourth series-connected element which includes a fourth switching element and electrically connects the reference signal generation circuit and the second input terminal of the sense amplifier.

3. The device of claim 2, wherein the read enable control circuit renders the first series-connected element and the fourth series-connected element conductive, thereby reading data of the first memory cell.

4. The device of claim 2, wherein the read enable control circuit renders the second series-connected element and the fourth series-connected element conductive, thereby reading data of the second memory cell.

5. The device of claim 2, wherein the read enable control circuit renders the first series-connected element and the third series-connected element conductive, thereby reading data of the first memory cell.

6. The device of claim 5, wherein the second memory cell stores complementary data of the first memory cell.

7. The device of claim 2, wherein:
the first switching element includes a first transistor having a gate to which a first read enable signal of "H" level or "L" level is supplied, and a second transistor having a gate to which a first signal of "M" level is supplied,
the second switching element includes a third transistor having a gate to which a second read enable signal of "H" level or "L" level is supplied, and a fourth transistor having a gate to which the first signal is supplied,
the third switching element includes a fifth transistor having a gate to which a third read enable signal of "H" level or "L" level is supplied, and a sixth transistor having a gate to which the first signal is supplied, and
the fourth switching element includes a seventh transistor having a gate to which a fourth read enable signal of "H" level or "L" level is supplied, and an eighth transistor having a gate to which a second signal of "M" level is supplied.

8. The device of claim 7, wherein an interconnection which supplies the third read enable signal is adjacent to an interconnection which supplies the first signal and/or an interconnection which supplies the second signal.

9. The device of claim 7, wherein the read enable control circuit includes:
a first NAND circuit which receives a third signal and outputs an operation result;
a first inverter circuit which receives a signal output from the first NAND circuit, inverts the signal, and outputs the first read enable signal;
a second NAND circuit which receives an inverted signal of the third signal and outputs an operation result;
a second inverter circuit which receives a signal output from the second NAND circuit, inverts the signal, and outputs the second read enable signal;
a third NAND circuit which receives a fourth signal and outputs an operation result;

a third inverter circuit which receives a signal output from the third NAND circuit, inverts the signal, and outputs the third read enable signal;
a fourth NAND circuit which receives an inverted signal of the fourth signal and outputs an operation result; and
a fourth inverter circuit which receives a signal output from the fourth NAND circuit, inverts the signal, and outputs the fourth read enable signal.

10. The device of claim 7, further comprising:
a fifth series-connected element which includes a fifth switching element and electrically connects the first memory cell and a first ground potential terminal; and
a sixth series-connected element which includes a sixth switching element and electrically connects the reference signal generation circuit and a second ground potential terminal.

11. The device of claim 10, wherein:
the fifth switching element includes a ninth transistor having a gate to which the first signal is supplied, and a 10th transistor having a gate to which a third signal of "L" level is supplied, and
the sixth switching element includes an 11th transistor having a gate to which the second signal is supplied, and a 12th transistor having a gate to which the third signal is supplied.

12. The device of claim 1, wherein the read enable control circuit comprises a read enable control circuit which generates the read enable signal based on an address signal input by the command from outside and controls switching between the single cell read mode and the twin cell read mode.

13. The device of claim 1, wherein the first memory cell is included in a first memory cell array and the second memory cell included in a second memory cell array.

14. The device on claim 1, further comprising:
a third memory cell having a variable resistive element and electrically connected to a third bit line; and
a fourth memory cell having a variable element and electrically connected to a fourth bit line
wherein the first and third bit lines are connected to the sense amplifier via a fifth bit line, and a second and fourth bit lines are connected to the sense amplifier via a sixth bit line.

15. A semiconductor memory device comprising:
a first memory cell having a variable resistive element and electrically connected to a first bit line;
a second memory cell having a variable resistive element and electrically connected to a second bit line;
a reference signal generation circuit which generates a reference signal;
a sense amplifier having a first input terminal and a second input terminal; and
a control circuit which controls switching between a single cell read mode and a twin cell read mode by controlling connections of the first and second bit lines with the sense amplifier in accordance with a command from outside.

16. The device of claim 15, further comprising:
a first series-connected element which includes a first switching element and electrically connects the first memory cell and the first input terminal of the sense amplifier;
a second series-connected element which includes a second switching element and electrically connects the second memory cell and the first input terminal of the sense amplifier;
a third series-connected element which includes a third switching element and electrically connects the second memory cell and the second input terminal of the sense amplifier; and
a fourth series-connected element which includes a fourth switching element and electrically connects the reference signal generation circuit and the second input terminal of the sense amplifier.

17. The device of claim 16, wherein the control circuit renders the first series-connected element and the fourth series-connected element conductive, thereby reading data of the first memory cell.

18. The device of claim 16, wherein the control circuit renders the second series-connected element and the fourth series-connected element conductive, thereby reading data of the second memory cell.

19. The device of claim 16, wherein the control circuit renders the first series-connected element and the third series-connected element conductive, thereby reading data of the first memory cell.

20. The device of claim 19, wherein the second memory cell stores complementary data of the first memory cell.

21. The device of claim 16, wherein:
the first switching element includes a first transistor having a gate to which a read enable signal of "H" level is supplied, and a second transistor having a gate to which a first analog signal of "M" level or "L" level is supplied,
the second switching element includes a third transistor having a gate to which the read enable signal is supplied, and a fourth transistor having a gate to which a second analog signal of "M" level or "L" level is supplied,
the third switching element includes a fifth transistor having a gate to which the read enable signal is supplied, and a sixth transistor having a gate to which a third analog signal of "M" level or "L" level is supplied, and
the fourth switching element includes a seventh transistor having a gate to which the read enable signal is supplied, and an eighth transistor having a gate to which a fourth analog signal of "M" level or "L" level is supplied.

22. The device of claim 15, wherein the control circuit comprises a read enable control circuit which generates an analog signal based on an address signal input by the command from outside and controls switching between the single cell read mode and the twin cell read mode.

23. The device of claim 15, wherein the first memory cell is included in a first memory cell array and the second memory cell is included in a second memory cell array.

24. The device of claim 15, further comprising:
a third memory cell having a variable resistive element and electrically connected to a third bit line; and
a fourth memory cell having a variable element and electrically connected to a fourth bit line
wherein the first and third bit lines are connected to the sense amplifier via a fifth bit line, and a second and fourth bit lines are connected to the sense amplifier via a sixth bit line.

* * * * *